(12) United States Patent
Lee et al.

(10) Patent No.: US 12,271,555 B2
(45) Date of Patent: Apr. 8, 2025

(54) TOUCH DETECTION DEVICE HAVING MOVABLE COLUMNAR CONDUCTORS, AND DISPLAY DEVICE INCLUDING THE SAME

(71) Applicant: Samsung Display Co., LTD., Yongin-si (KR)

(72) Inventors: Jeong Yoon Lee, Yongin-si (KR); Yu Jin Choe, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/360,054

(22) Filed: Jul. 27, 2023

(65) Prior Publication Data

US 2024/0201812 A1 Jun. 20, 2024

(30) Foreign Application Priority Data

Dec. 14, 2022 (KR) .......................... 10-2022-0174817

(51) Int. Cl.
*G06F 3/041* (2006.01)
*G06F 3/044* (2006.01)
*H10K 59/40* (2023.01)

(52) U.S. Cl.
CPC .......... *G06F 3/0418* (2013.01); *G06F 3/0412* (2013.01); *G06F 3/04164* (2019.05);
(Continued)

(58) Field of Classification Search
None
See application file for complete search history.

(56) References Cited

U.S. PATENT DOCUMENTS

2014/0071065 A1\* 3/2014 Kung ...................... G06F 3/041
345/173
2016/0147362 A1\* 5/2016 Eim ...................... G06F 3/0416
345/173

(Continued)

FOREIGN PATENT DOCUMENTS

KR 10-1860880 5/2018
KR 10-2019-0113128 10/2019
(Continued)

*Primary Examiner* — Amr A Awad
*Assistant Examiner* — Donna V Bocar
(74) *Attorney, Agent, or Firm* — KILE PARK REED & HOUTTEMAN PLLC

(57) ABSTRACT

A touch detection device includes a touch area including multiple driving electrodes and multiple detecting electrodes intersecting the driving electrodes, and including a first area that is flat, and a second area that extends from the first area in a first direction and is flat or bent based on a movement of a roller member, a first pad portion disposed adjacent to an edge of the touch area and including a first driving pad portion connected to multiple first driving electrodes disposed in the first area through multiple first driving lines, and a first detecting pad portion connected to multiple first detecting electrodes disposed in the first area through multiple detecting lines, and a second pad portion disposed adjacent to the edge of the touch area and including a second driving pad portion connected to multiple second driving electrodes disposed in the second area through multiple second driving lines.

20 Claims, 16 Drawing Sheets

(52) U.S. Cl.
CPC ........... *G06F 3/0446* (2019.05); *H10K 59/40* (2023.02); *G06F 2203/04102* (2013.01); *G06F 2203/04111* (2013.01)

(56) References Cited

U.S. PATENT DOCUMENTS

| | | | | |
|---|---|---|---|---|
| 2017/0153750 A1* | 6/2017 | Jung | ..................... | G06F 3/044 |
| 2018/0157361 A1* | 6/2018 | Kim | ..................... | G06F 3/0446 |
| 2019/0236987 A1* | 8/2019 | Koo | ..................... | H10K 77/111 |
| 2021/0303121 A1* | 9/2021 | Ku | ..................... | G06F 3/0446 |

FOREIGN PATENT DOCUMENTS

| | | |
|---|---|---|
| KR | 10-2022-0089606 | 6/2022 |
| KR | 10-2419325 | 7/2022 |

\* cited by examiner

511: 5111, 5112

TOUCH DETECTION DEVICE HAVING MOVABLE COLUMNAR CONDUCTORS, AND DISPLAY DEVICE INCLUDING THE SAME

CROSS REFERENCE TO RELATED APPLICATION(S)

This application claims priority to and benefits of Korean Patent Application No. 10-2022-0174817 under 35 U.S.C. § 119, filed on Dec. 14, 2022, in the Korean Intellectual Property Office (KIPO), the entire contents of which are incorporated herein by reference.

BACKGROUND

1. Technical Field

The disclosure relates to a touch detection device and a display device including the same.

2. Description of the Related Art

Display devices may be flat panel display devices such as liquid crystal display devices, field emission display devices, organic light emitting display devices, or the like. Among the flat panel display devices, the light emitting display device may include a light emitting element in which each of the pixels of a display panel emits light by itself, thereby displaying an image without a light emitting device providing the light to the display panel.

The display device may include a touch detection device that detects a touch input as an input device. The touch detection device may include a capacitive touch sensor to determine whether a user's touch is input and to calculate an area (e.g., touch input coordinates) where the touch input is detected.

The display devices are gradually changing into various shapes, away from a uniform rectangular shape. For example, as a flexible display panel is applied to the display device, the display device is being researched and developed to have a form factor that can fold, bend, roll, or unfold display panel.

SUMMARY

The disclosure provides a touch detection device that can reduce malfunction of a touch sensor and waste of power when a portion of a flexible display panel is curved, bent, folded, or rolled in a display device to which the flexible display panel is applied, and a display device including the same.

The disclosure also provides a touch detection device with reduced non-display area (or a bezel area) by minimizing lines of an outer portion due to an increase in touch area in a display device to which a flexible display panel is applied, and a display device including the same.

The disclosure also provides a touch detection device that can control a flexible display panel and a touch sensor by detecting a change in the flexible display panel when a portion of the flexible display panel is curved, bent, folded, or rolled even without a separate sensor in a display device to which the flexible display panel is applied, and a display device including the same.

According to an embodiment of the disclosure, a touch detection device may include a touch area including a plurality of driving electrodes and a plurality of detecting electrodes intersecting the plurality of driving electrodes, and including a first area that is flat, and a second area that extends from the first area in a first direction and is flat or bent based on a movement of a first roller member, a first pad portion disposed adjacent to an edge of the touch area and including a first driving pad portion electrically connected to a plurality of first driving electrodes disposed in the first area through a plurality of first driving lines, and a first detecting pad portion electrically connected to a plurality of first detecting electrodes disposed in the first area through a plurality of detecting lines, and a second pad portion disposed adjacent to the edge of the touch area and including a second driving pad portion electrically connected to a plurality of second driving electrodes disposed in the second area through a plurality of second driving lines. Each of the plurality of second driving lines may include a first line section connected to one of the plurality of second driving electrodes and extending in the first direction, and a second line section bent from an end of the first line section to a second direction perpendicular to the first direction and connected to the second driving pad portion, and the first line section may include a first sub-section including a columnar conductor and a second sub-section that does not include the columnar conductor.

The touch detection device may further include a touch control circuit electrically connected to the plurality of driving electrodes and the plurality of detecting electrodes and detecting a change in capacitance of each of a plurality of touch nodes through the plurality of detecting electrodes. The touch control circuit may detect a resistance of each of the plurality of second driving lines, determine a position of a first bending axis on which the second area is bent based on detecting that an amount of change in resistance of one of the plurality of second driving lines exceeds a threshold, and adjust an active area of the touch detection device based on the determined position of the first bending axis.

The touch area may further include a third area extending in a direction opposite to the first direction from the first area and being flat or bent based on a movement of a second roller member. The touch detection device may further include a third pad portion including a third driving pad portion electrically connected to a plurality of third driving electrodes disposed in the third area through a plurality of third driving lines and disposed adjacent to the edge of the touch area. Each of the plurality of third driving lines may include a first line section connected to one of the plurality of third driving electrodes and extending in the first direction, and a second line section bent from an end of the first line section to the second direction and connected to the third driving pad portion. The first line section of each of the plurality of third driving lines may include a first sub-section including the columnar conductor and a second sub-section that does not include the columnar conductor.

The touch control circuit may detect a resistance of each of the plurality of third driving lines, determine a position of a second bending axis on which the third area is bent based on detecting that an amount of change in resistance of one of the plurality of third driving lines exceeds the threshold, and adjust the active area of the touch detection device based on the determined position of the second bending axis.

The touch control circuit may supply a touch driving signal to the plurality of first driving lines, the plurality of second driving lines, and the plurality of third driving lines disposed in the active area, and dose not supply the touch driving signal to the plurality of first driving lines, the plurality of second driving lines, and the plurality of third driving lines not disposed in the active area.

The touch detection device may further include a plurality of driving contact portions connecting the plurality of second driving lines and the plurality of second driving electrodes. The plurality of driving contact portions may be connected to the plurality of second driving electrodes in each column in a one-to-one manner, and distances between a first boundary between the first area and the second area and the plurality of driving contact portions may be different.

The distances between the first boundary and the plurality of driving contact portions may increase from one of the plurality of first driving contact portions connected to one of the plurality of second driving electrodes disposed in a column closest to the first boundary portion toward another one of the plurality of driving contact portions connected to another one of the plurality of second driving electrodes disposed in another column farthest from the first boundary portion.

The plurality of driving electrodes disposed in a column may be electrically connected to each other through a bridge electrode. The plurality of second driving lines and the bridge electrode may be formed on a same layer.

Each of the plurality of driving contact portions may include a first overlapping portion overlapping the plurality of driving electrodes in a plan view and being a portion of the first sub-section including the columnar conductor, and a second overlapping portion overlapping the plurality of driving electrodes in a plan view, surrounding an edge of the first overlapping portion in a plan view, and not including the columnar conductor.

An area occupied by the second overlapping portion in each of the plurality of driving contact portions may increase from one of the plurality of driving contact portions disposed in a column closest to the first boundary portion toward another one of the plurality of driving contact portions disposed in another column farthest from the first boundary portion.

The touch detection device may further include a plurality of detecting contact portions connecting the plurality of first detecting lines and the plurality of first detecting electrodes in the first area. The plurality of detecting contact portions may be connected to the plurality of first detecting electrodes in each row, and two of the plurality of detecting contact portions may be formed in each row.

According to an embodiment of the disclosure, a display device may include a light emitting layer disposed on a substrate and emitting light, and a touch detecting portion disposed on the light emitting layer and detecting a touch input. The touch detecting portion may include a touch area including a plurality of driving electrodes and a plurality of detecting electrodes intersecting the plurality of driving electrodes, and including a first area that is flat, and a second area that extends from the first area in a first direction and is flat or bent based on a movement of a first roller member, a first pad portion disposed adjacent to an edge of the touch area and including a first driving pad portion electrically connected to a plurality of first driving electrodes disposed in the first area through a plurality of first driving lines, and a first detecting pad portion electrically connected to a plurality of first detecting electrodes disposed in the first area through a plurality of detecting lines, and a second pad portion disposed adjacent to the edge of the touch area and including a second driving pad portion electrically connected to a plurality of second driving electrodes disposed in the second area through a plurality of second driving lines. Each of the plurality of second driving lines may include a first line section connected to one of the plurality of second driving electrodes and extending in the first direction, and a second line section bent from an end of the first line section to a second direction perpendicular to the first direction and connected to the second driving pad portion. The first line section may include a first sub-section including a columnar conductor and a second sub-section not including the columnar conductor.

The display device may further include a touch control circuit electrically connected to the plurality of driving electrodes and the plurality of detecting electrodes and detecting a change in capacitance of each of a plurality of touch nodes through the plurality of detecting electrodes. The touch control circuit may detect resistance of each of the plurality of second driving lines, determine a position of a first bending axis on which the second area is bent based on detecting that an amount of change in resistance of one of the plurality of second driving lines exceeds a threshold, and adjust an active area of the touch detection device based on the determined position of the first bending axis.

The touch area may further include a third area extending in a direction opposite to the first direction from the first area and being flat or bent based on a movement of a second roller member. The touch detection device may further include a third pad portion including a third driving pad portion electrically connected to a plurality of third driving electrodes disposed in the third area through a plurality of third driving lines and disposed adjacent to the edge of the touch area. Each of the plurality of third driving lines may include a first line section connected to one of the plurality of third driving electrodes and extending in the first direction, and a second line section bent from an end of the first line section to the second direction and connected to the third driving pad portion. The first line section of each of the plurality of third driving lines may include a first sub-section including the columnar conductor and a second sub-section that does not include the columnar conductor.

The touch control circuit may detect a resistance of each of the plurality of third driving lines, determine a position of a second bending axis on which the third area is bent based on detecting that an amount of change in resistance of one of the plurality of third driving lines exceeds the threshold, and adjust an active area of the touch detection device based on the determined position of the second bending axis.

The touch control circuit may supply a touch driving signal to the plurality of first driving lines, the plurality of second driving lines, and the plurality of third driving lines disposed in the active area, and may not supply the touch driving signal to the plurality of first driving lines, the plurality of second driving lines, and the plurality of third driving lines not disposed in the active area.

The display device may further include a plurality of driving contact portions connecting the plurality of second driving lines and the plurality of second driving electrodes. The plurality of driving contact portions may be connected to the plurality of second driving electrodes in each column in a one-to-one manner, and distances between a first boundary between the first area and the second area and the plurality of driving contact portions may be different.

The distances between the first boundary and the plurality of driving contact portions may increase from one of the plurality of first driving contact portions connected to one of the plurality of second driving electrodes disposed in a column closest to the first boundary portion toward another one of the plurality of driving contact portions connected to another one of the plurality of second driving electrodes disposed in another column farthest from the first boundary portion.

The plurality of driving electrodes disposed in a column may be electrically connected to each other through a bridge electrode. The plurality of second driving lines and the bridge electrode may be formed on a same layer.

Each of the plurality of driving contact portions may include a first overlapping portion overlapping the plurality of driving electrodes in a plan view and being a portion of the first sub-section including the columnar conductor, and a second overlapping portion overlapping the plurality of driving electrodes in a plan view, surrounding an edge of the first overlapping portion in a plan view, and not including the columnar conductor.

According to the touch detection device and the display device including the same according to the embodiment, when a portion of the display panel is curved, bent, folded, or rolled, malfunction of the touch sensor and waste of power may be reduced.

Further, an area of the non-display area (or the bezel area) may be reduced by minimizing the lines of the outer portion according to the increase in touch area.

Further, the display panel and the touch sensor may be controlled by detecting such a change in the display panel when a portion of the display panel is curved, bent, folded, or rolled even without a separate sensor, and the number of parts for sensing constant changes may be reduced.

However, embodiments are not restricted to those set forth herein. The above and other embodiments will become more apparent to one of ordinary skill in the art to which the disclosure pertains by referencing the detailed description of the disclosure given below.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
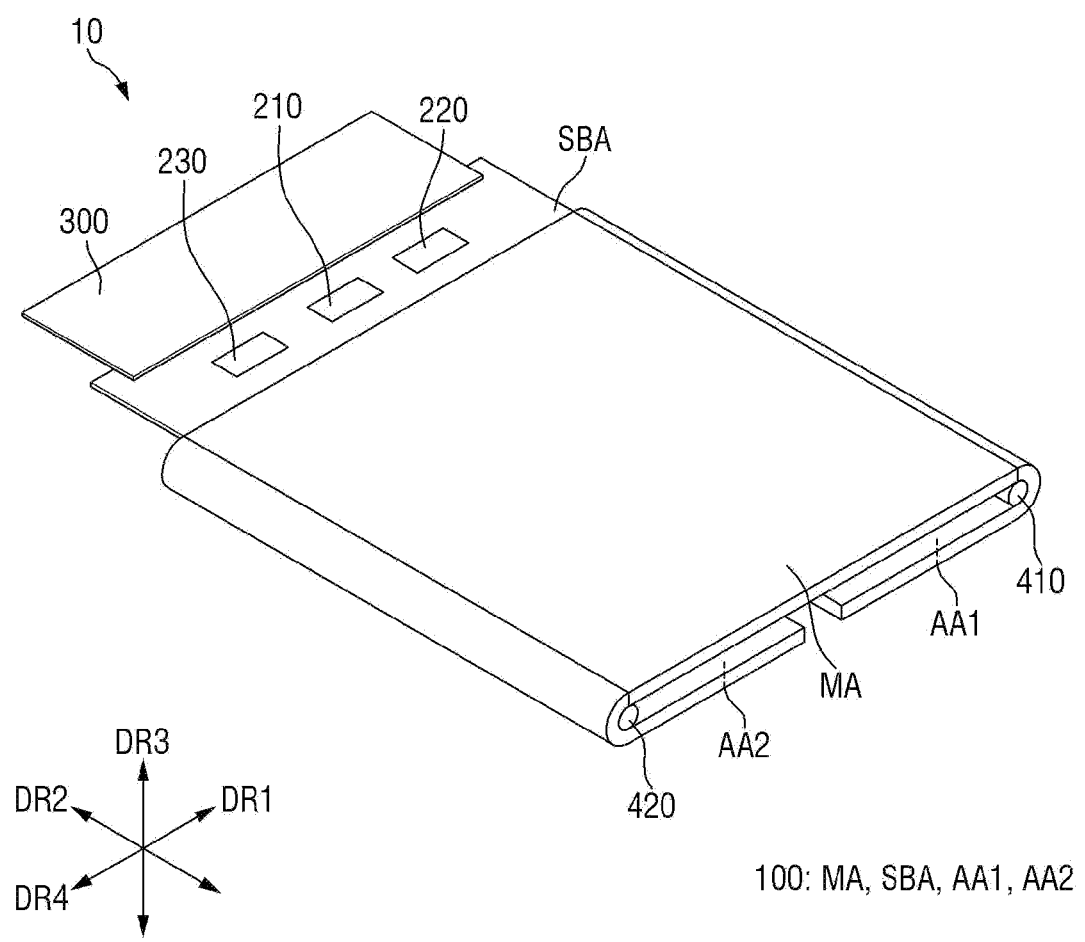
FIG. 1 is a schematic perspective view illustrating a first state of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising." "includes," and/or "including." when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on." "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

The display surface may be parallel to a surface defined by a first direction DR1 and a second direction DR2. A normal direction of the display surface, i.e., a thickness direction of the display device DD, may indicate a third direction DR3. In this specification, an expression of "when viewed from a plane or on a plane" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will fully convey the scope of the disclosure to those skilled in the art.

It will also be understood that when a layer is referred to as being "on" another layer or substrate, it can be directly on another layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Features of each of various embodiments of the disclosure may be partially or entirely combined with each other and may technically variously interwork with each other, and embodiments may be implemented independently of each other or may be implemented together in association with each other.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, specific embodiments will be described with reference to the accompanying drawings.

Figure 2:
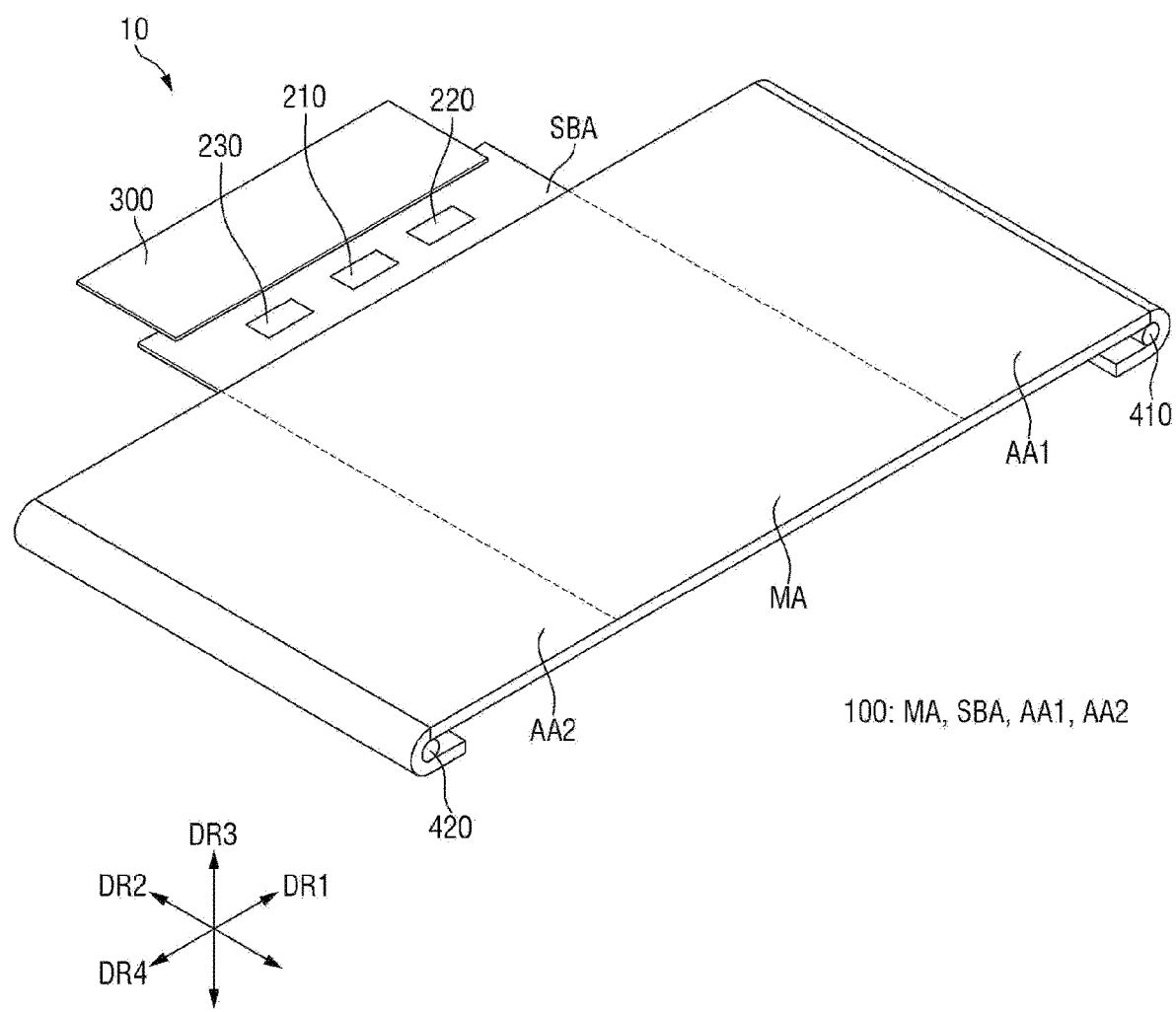
FIG. 2 is a schematic perspective view illustrating a second state of the display device according to an embodiment.

FIGS. 1 and 2 are schematic perspective views illustrating a display device 10 according to an embodiment. FIG. 1 is a schematic perspective view illustrating a first state of the display device 10, and FIG. 2 is a schematic perspective view illustrating a second state of the display device 10.

Referring to FIGS. 1 and 2, the display device 10 may be applied to portable electronic devices such as mobile phones, smartphones, tablet personal computers (PCs), mobile communication terminals, electronic notebooks, electronic books, portable multimedia players (PMPs), navigation devices, ultra mobile PCs (UMPCs), and the like. In another embodiment, the display device 10 may be applied to a display part of a television, a laptop computer, a monitor, a billboard, Internet of Things (IOT), or the like. In another embodiment, the display device 10 may be applied to a wearable device such as a smart watch, a watch phone, a glasses-type display, a head mounted display (HMD), and the like.

The display device 10 may be a light emitting display device 10 using an organic light emitting diode, a quantum dot light emitting display device 10 including a quantum dot light emitting layer, an inorganic light emitting display device 10 including an inorganic semiconductor, a micro or nano light emitting display device 10 using a micro or nano light emitting diode (micro LED or nano LED), or the like. Hereinafter, it is described that the display device 10 is the organic light emitting display device 10, but the disclosure is not limited thereto.

The display device 10 may include a display panel 100, a first pad portion 210, a second pad portion 220, a third pad portion 230, a circuit board 300, a first roller 410, and a second roller 420.

The display panel 100 may be a flexible display panel 100 that can be curved, bent, folded, or rolled by the first roller 410 and the second roller 420. The display panel 100 may include a main area MA, a sub-area SBA, a first auxiliary area AA1, and a second auxiliary area AA2.

In FIGS. 1 and 2, a first direction DR1 may be a horizontal direction of the display panel 100, a second direction DR2 may be a vertical direction of the display panel 100, a third direction DR3 may be a thickness direction of the display panel 100, and a fourth direction DR4 may be the horizontal direction of the display panel 100 and a direction opposite to the first direction DR1. "Left", "right", "upper", and "lower" may be directions when the display panel 100 is viewed in a plan view. For example, "right side" may be a side in the first direction DR1, "left side" may be another side in the first direction DR1, "upper side" may be a side in the second direction DR2, and "lower side" may be another side in the second direction DR2. In addition, "upper portion" may be a side in the third direction DR3, and "lower portion" may be another side in the third direction DR3.

The main area MA may be a flat area that is not curved, bent, folded, or rolled, but the disclosure is not limited thereto. The main area MA may have a quadrangular shape in a plan view, but the disclosure is not limited thereto. A length of the main area MA in the first direction DR1 may be greater than a length of the main area MA in the second direction DR2. In another embodiment, a length of the main area MA in the first direction DR1 may be less than a length of the main area MA in the second direction DR2.

The sub-area SBA may be disposed on a side of the main area MA in the second direction DR2. For example, the sub-area SBA may extend in the second direction DR2 from the main area MA.

The sub-area SBA may be an area that can be curved, bent, folded, or rolled. When the sub-area SBA is curved, bent, folded, or rolled, the sub-area SBA may overlap the main area MA in the third direction DR3 (or Z-axis direction). The sub-area SBA may have a quadrangular shape in a plan view, but the disclosure is not limited thereto.

A length of the sub-area SBA in the first direction DR1 and the length of the main area MA in the first direction DR1 may be substantially the same. In another embodiment, the length of the sub-area SBA in the first direction DR1 may be less than the length of the main area MA in the first direction DR1. A length of the sub-area SBA in the second direction DR2 may be less than the length of the main area MA in the second direction DR2.

The sub-area SBA may include the pad portions 210, 220, and 230 electrically connected to the circuit board 300. In another embodiment, the sub-area SBA may be omitted, and the pad portions 210, 220, and 230 may be disposed in the main area MA.

The first auxiliary area AA1 may be disposed on a side of the main area MA in the first direction DR1. For example, the first auxiliary area AA1 may extend in the first direction DR1 from the main area MA.

The second auxiliary area AA2 may be disposed on another side of the main area MA in the fourth direction DR4. For example, the second auxiliary area AA2 may extend in the fourth direction DR4 from the main area MA.

The first auxiliary area AA1 and the second auxiliary area AA2 may be areas that can be curved or bent. The first auxiliary area AA1 may be curved, bent, folded, or rolled along the first roller 410. The second auxiliary area AA2 may be curved, bent, folded, or rolled along the second roller 420.

The first pad portion 210 may include a display driving pad (not illustrated) that is electrically connected to the circuit board 300 and outputs signals and voltages for driving the display panel 100. For example, the first pad portion 210 may output data voltages to data lines of the display panel 100 and output a power voltage to a power line of the display panel 100.

Figure 4:
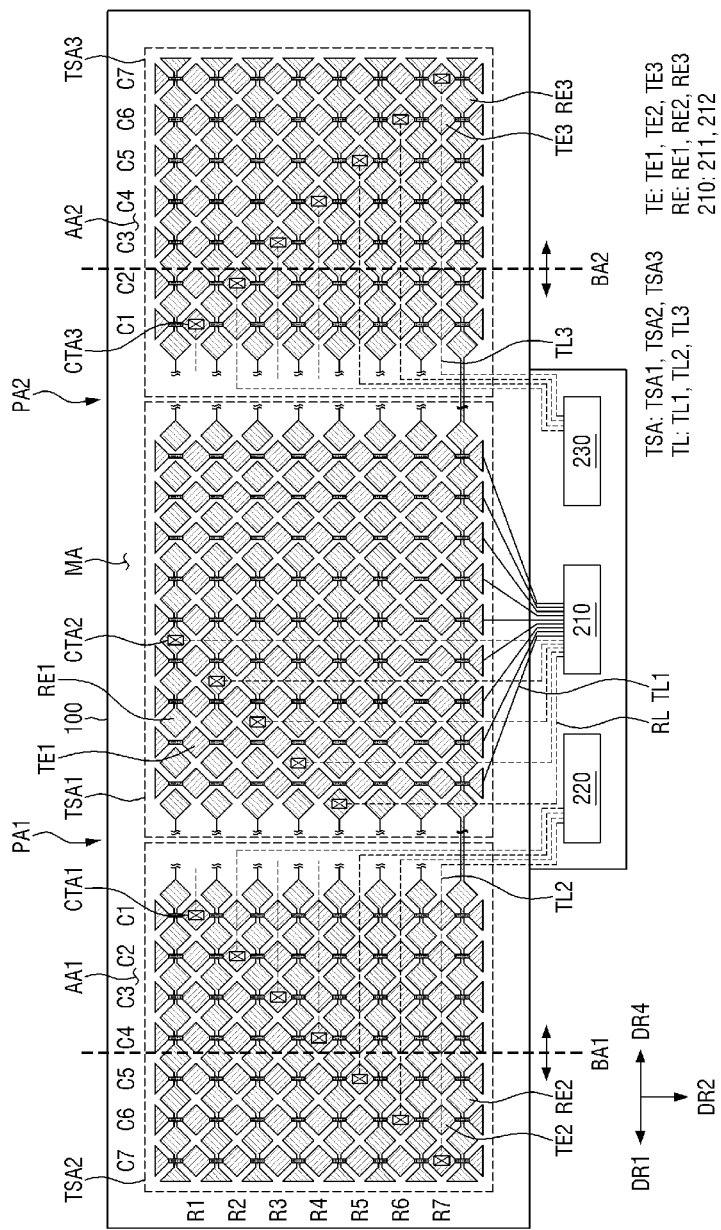
FIG. 4 is a schematic plan view illustrating a touch area and lines connected to the touch area of the display device according to an embodiment.

The first pad portion 210 may include pads for driving touch electrodes (see, e.g., driving electrodes TE and detecting electrodes RE in FIG. 4) formed in a first area (see, e.g., TSA1 in FIG. 4) corresponding to the main area MA. For example, the first pad portion 210 may include a first driving pad portion and a first detecting pad portion. The first driving pad portion may be connected to multiple first driving lines (see, e.g., TL1 in FIG. 4), and may be connected to multiple first driving electrodes (see, e.g., TE1 in FIG. 4) formed in the first area TSA1 corresponding to the main area MA through the first driving lines TL1. The first detecting pad portion may be connected to multiple detecting lines (see, e.g., RL in FIG. 4), and may be connected to multiple first detecting electrodes (see, e.g., RE1 in FIG. 4) formed in the first area TSA1 corresponding to the main area MA through the detecting lines RL. The first detecting electrodes RE1 formed in the first area TSA1 may be electrically connected to multiple second detecting electrodes RE2 disposed in the first auxiliary area AA1 and multiple third detecting electrodes (see, e.g., RE3 in FIG. 4) disposed in the second auxiliary area AA2. Therefore, the first detecting pad portion of the first pad portion 210 may be electrically connected to the detecting electrodes RE disposed in the main area MA, the first auxiliary area AA1, and the second auxiliary area AA2.

The second pad portion 220 may include pads for driving touch electrodes (e.g., driving electrodes TE and detecting electrodes RE) formed in a second area TSA2 corresponding to the first auxiliary area AA1. For example, the second pad portion 220 may include a second driving pad portion. The second driving pad portion may be connected to multiple second driving lines TL2, and may be connected to multiple second driving electrodes TE2 formed in the second area TSA2 corresponding to the first auxiliary area AA1 through the second driving lines TL2.

The third pad portion 230 may include pads for driving touch electrodes (e.g., driving electrodes TE and detecting electrodes RE) formed in a third area TSA3 corresponding to the second auxiliary area AA2. For example, the third pad portion 230 may include a third driving pad portion (not illustrated). The third driving pad portion may be connected to multiple third driving lines (see, e.g., TL3 in FIG. 4), and may be connected to multiple third driving electrodes (see, e.g., TE3 in FIG. 4) formed in the third area TSA3 corresponding to the second auxiliary area AA2 through the third driving lines TL3.

The second pad portion 220 may be disposed closer to the first auxiliary area AA1 compared to the third pad portion 230 in the sub-area SBA. The third pad portion 230 may be disposed closer to the second auxiliary area AA2 compared to the second pad portion 220 in the sub-area SBA.

The circuit board 300 may be attached to the sub area SBA of the display panel 100 using an anisotropic conductive film (ACF). The circuit board 300 may be electrically connected to the pad portions 210, 220, and 230 of the display panel 100. The circuit board 300 may be a flexible film such as a flexible printed circuit board, a printed circuit board, a chip on film, or the like.

A display driving portion (not illustrated) formed of an integrated circuit (IC) may be mounted on the circuit board 300. The display driving portion may be electrically connected to the first pad portion 210 to output signals and voltages for driving the display panel 100. For example, the display driving portion may output data voltages to data lines of the display panel 100 and output a power voltage to a power line of the display panel 100. Although it is described in the disclosure that the display driving portion is mounted on the circuit board 300, the disclosure is not limited thereto. For example, the display driving portion may be mounted on the display panel 100.

A touch control circuit (not illustrated) formed of an integrated circuit (IC) may be mounted on the circuit board 300. The touch control circuit may be electrically connected to the first pad portion 210, the second pad portion 220, and the third pad portion 230 to drive and control the touch electrodes (e.g., the driving electrodes TE and the detecting electrodes RE). The touch control circuit may detect a change in capacitance of each of multiple touch nodes through the detecting electrodes RE to calculate whether or not a touch is input and touch coordinates. The touch nodes may be nodes formed by intersecting the driving electrodes TE and the detecting electrodes RE. Although it is described in the disclosure that the touch control circuit is mounted on the circuit board 300, the disclosure is not limited thereto. For example, the touch control circuit may be mounted on the display panel 100.

Each of the first roller 410 and the second roller 420 may have a length extending in the second direction DR2. Each of the first roller 410 and the second roller 420 may move in the first direction DR1 or may move in the fourth direction DR4. In another embodiment, each of the first roller 410 and the second roller 420 may rotate in a first rotational direction or a second rotational direction. The first rotational direction may be a clockwise direction, and the second rotational direction may be a counterclockwise direction in a cross-sectional view.

In case that the first roller 410 moves in the first direction DR1 or rotates in the second rotational direction, the first auxiliary area AA1 visible from a front surface of the display device 10 may slide out from a rear surface of the display panel 100 and become wider. In case that the first roller 410 moves in the fourth direction DR4 or rotates in the first rotational direction, the first auxiliary area AA1 visible from the front surface of the display device 10 may slide in to the rear surface of the display panel 100 and become narrower.

When the second roller 420 moves in the fourth direction DR4 or rotates in the first rotational direction, the second auxiliary area AA2 visible from the front surface of the display device 10 may slide out from the rear surface of the display panel 100 and become wider. When the second roller 420 moves in the first direction DR1 or rotates in the second rotational direction, the second auxiliary area AA2 visible from the front surface of the display device 10 may slide in from the rear surface of the display panel 100 and become narrower.

As illustrated in FIG. 2, in case that not only the main area MA but also substantially an entire area of the first auxiliary area AA1 and substantially an entire area of the second auxiliary area AA2 are visible from the front surface of the display device 10, the display device 10 may be defined as a first state. The first state may be referred to as a "slide-out state" or a "maximum extension state".

As illustrated in FIG. 1, in case that only the main area MA is substantially visible from the front surface of the display device 10 and the first auxiliary area AA1 and the second auxiliary area AA2 are not visible from the front surface of the display device 10, the display device 10 may be defined as a second state. The second state may be referred to as a "slide-in state" or a "maximum reduction state".

In an embodiment, the display device 10 may form a third state, which is a state between the first state and the second state. For example, the third state may be referred to as an "intermediate state" or a "third shape". The third state may include a free stop state.

It is described in the disclosure that the display panel 100 includes the first auxiliary area AA1 and the second auxiliary area AA2, but the disclosure is not limited thereto. For example, the display panel 100 may include only the first auxiliary area AA1. In the following description, the second auxiliary area AA2 and the components disposed in the second auxiliary area AA2 may be omitted.

Figure 3:
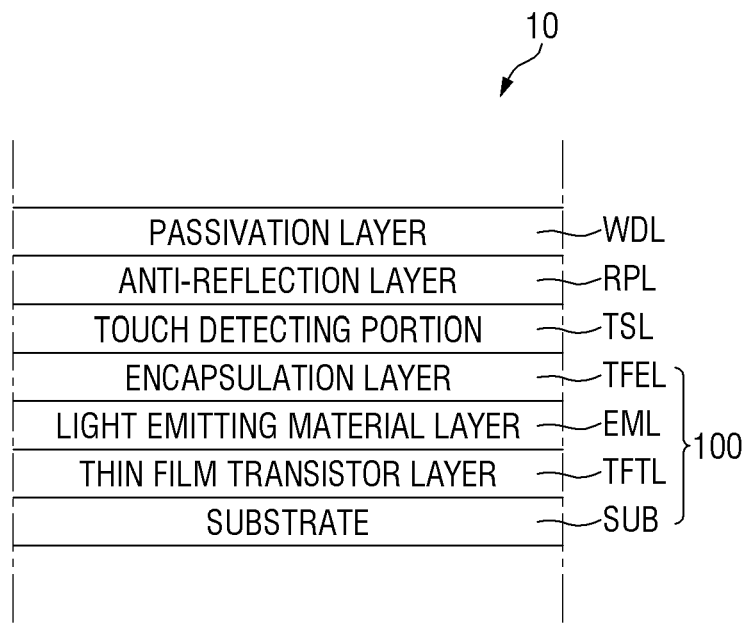
FIG. 3 is a schematic cross-sectional view illustrating a stacked structure of the display device according to an embodiment.

FIG. 3 is a schematic cross-sectional view illustrating a stacked structure of the display device 10 according to an embodiment.

Referring to FIG. 3, the display device 10 according to an embodiment may include a substrate SUB, a thin film transistor layer TFTL, a light emitting layer EML, an encapsulation layer TFEL, a touch detecting portion TSL, an anti-reflection layer RPL, and a passivation layer WDL. The display panel 100 may include the substrate SUB, the thin film transistor layer TFTL, the light emitting layer EML, and the encapsulation layer TFEL.

The substrate SUB may be made of an insulating material such as a polymer resin or the like. For example, the substrate SUB may include polyimide. The substrate SUB may be a flexible substrate that may be curved, bent, folded, or rolled.

The thin film transistor layer TFTL may be disposed on a surface of the substrate SUB. The thin film transistor layer TFTL may include multiple thin film transistors for driving light emitting elements of the light emitting layer EML.

The light emitting layer EML may be disposed on a surface of the thin film transistor layer TFTL. The light emitting layer EML may include light emitting elements that emit light. Each of the light emitting elements may emit light with a luminance according to an anode voltage and a cathode voltage applied from the thin film transistor layer TFTL.

Each of the light emitting elements may be an organic light emitting diode including an anode electrode, a cathode electrode, and an organic light emitting layer disposed between the anode electrode and the cathode electrode. In another embodiment, each of the light emitting elements may be an inorganic light emitting element including an anode electrode, a cathode electrode, and an inorganic semiconductor disposed between the anode electrode and the cathode electrode. In another embodiment, each of the light emitting elements may be a quantum dot light emitting element including an anode electrode, a cathode electrode, and a quantum dot light emitting layer disposed between the anode electrode and the cathode electrode. In another embodiment, each of the light emitting elements may be a micro light emitting diode.

The encapsulation layer TFEL may be disposed on a surface of the light emitting layer EML. The encapsulation layer TFEL may include at least one inorganic film, or at least one inorganic film and at least one organic film. In another embodiment, the encapsulation layer TFEL may be a glass substrate, an encapsulation film, or the like.

The touch detecting portion TSL may be disposed on a surface of the encapsulation layer TFEL.

The touch detecting portion TSL may detect a touch input by touch electrodes (e.g., driving electrodes TE and detecting electrodes RE). The touch detecting portion TSL may detect the touch input in a mutual capacitance manner. According to another embodiment, the touch detecting portion TSL may detect a touch input by multiple sensor electrodes, and the touch detecting portion TSL may detect the touch input in a self-capacitance manner.

The anti-reflection layer RPL may be disposed on a surface of the touch detecting portion TSL. The anti-reflection layer RPL may serve to prevent decrease in image visibility of the display panel 100 due to reflection of external light. The anti-reflection layer RPL may include a phase retardation film such as a linear polarizing plate, a λ/4 plate (quarter-wave plate), and the like. In another embodiment, the anti-reflection layer RPL may include color filters that selectively transmit light of a specific wavelength.

The passivation layer WDL may be disposed on a surface of the anti-reflection layer RPL. The passivation layer WDL may be a cover window formed of a polymer resin, glass, or the like. The passivation layer WDL may be attached onto a surface of the anti-reflection layer RPL by a transparent adhesive film, a transparent adhesive, or the like.

FIG. 4 is a schematic plan view illustrating a touch area TSA and lines connected to the touch area TSA of the display device 10 according to an embodiment.

Referring to FIG. 4, the touch detecting portion TSL according to an embodiment may be a touch sensor, and may include a touch area TSA including touch electrodes (e.g., driving electrodes TE and detecting electrodes RE).

The touch area TSA may be formed to substantially correspond to a display area of the display panel 100. For example, an area of the touch area TSA and an area of the display area of the display panel 100 may be substantially the same. As described above, the display panel 100 according to an embodiment may be divided into the main area MA, the first auxiliary area AA1, and the second auxiliary area AA2. Therefore, the touch area TSA may include a first area TSA1 corresponding to the main area MA, a second area TSA2 corresponding to the first auxiliary area AA1, and a third area TSA3 corresponding to the second auxiliary area AA2.

The first area TSA1 of the touch area TSA may be referred to as a first sub-touch area, but the disclosure is not limited thereto. The second area TSA2 of the touch area TSA may be referred to as a second sub-touch area, but the disclosure is not limited thereto. The third area TSA3 of the touch area TSA may be referred to as a third sub-touch area, but the disclosure is not limited thereto. Hereinafter, for convenience of description, the touch area TSA will be described as including the first area TSA1, the second area TSA2, and the third area TSA3.

The first area TSA1, which is an area corresponding to the main area MA in which the display device 10 continuously displays an image, may be a flat area (e.g., always a flat area). For example, the first area TSA1 may be a flat area regardless of a state change of the display device 10 (e.g., the first state or the second state of the display device 10).

The second area TSA2 and the third area TSA3 may be areas that are flat or bent (or curved, folded, or rolled) based on movement or rotation of roller members (see, e.g., 410 and 420 in FIG. 1) of the display device 10. For example, each of the second area TSA2 and the third area TSA3 may maintain a bent (or curved, folded, or rolled) shape or a flat shape according to a state change of the display device 10. For example, in the first state of the display device 10, the second area TSA2 and the third area TSA3 may be disposed on the front surface of the display device 10 and maintain a flat shape. In case that the display device 10 changes from the first state to the second state, from the second state to the first state, or is in the third state (e.g., the intermediate state), a portion of each of the second area TSA2 and the third area TSA3 may be positioned adjacent to the rollers (see, e.g., 410 and 420 in FIG. 1), so that the second area TSA2 and the third area TSA3 may maintain the bent shape. In case that the display device 10 changes from the first state to the second state, from the second state to the first state, or is in the third state (e.g., the intermediate state), another portion of each of the second area TSA2 and the third area TSA3 may be disposed on the front or adjacent to the rear surface of the display device 10 and maintain the flat shape.

The touch area TSA may include multiple driving electrodes TE and multiple detecting electrodes RE intersecting the driving electrodes TE. In the touch area TSA, multiple touch nodes may be formed as the driving electrodes TE and the detecting electrodes RE intersect each other. The touch control circuit may detect a touch by detecting a change in capacitance of the touch nodes.

The driving electrodes TE may be arranged in a matrix form, and may be disposed to form the second area TSA2 and the third area TSA3 from the first area TSA1. The driving electrodes TE disposed in each column of the driving electrodes TE may be electrically connected to each other through a bridge electrode (see, e.g., CE in FIG. 6). Accordingly, the driving electrodes TE may be disposed to extend in a direction (e.g., the second direction DR2 or the vertical direction of the display panel 100) parallel to a first bending axis BA1 on which the first area TSA1 is bent within the touch area TSA. For example, the driving electrodes TE may be disposed to extend in the vertical direction of the display panel 100. The first bending axis BA1 may move between a first boundary portion PA1 disposed between the first area TSA1 and the second area TSA2 and an end of the second area TSA2 based on the state change of the display device 10. For example, in case that the display device 10 is in the second state, the first bending axis BA1 may be positioned closest to the first boundary portion PA1 between the first area TSA1 and the second area TSA2. On the other hand, in case that the display device 10 is in the first state, the first bending axis BA1 may be positioned to be maximally spaced apart from the first boundary portion PA1 between the first area TSA1 and the second area TSA2 in the first direction DR1.

The driving electrodes TE may include multiple first driving electrodes TE1 disposed in the first area TSA1, multiple second driving electrodes TE2 disposed in the second area TSA2, and multiple third driving electrodes TE3 disposed in the third area TSA3. It is illustrated in FIG. 4 that the second driving electrodes TE2 disposed in the second area TSA2 are arranged in 7 rows (R1 to R7) and 7 columns (C1 to C7), but the disclosure is not limited thereto. It is illustrated in FIG. 4 that the third driving electrodes TE3 disposed in the third area TSA3 are arranged in 7 rows (R1 to R7) and 7 columns (C1 to C7), but the disclosure is not limited thereto.

The detecting electrodes RE may be disposed to extend in a direction (e.g., the first direction DR1 or the horizontal direction of the display panel 100) perpendicular to the first bending axis BA1. The detecting electrodes RE adjacent to each other in the direction (e.g., the first direction DR1) perpendicular to the first bending axis BA1 may be electrically connected to each other through a connection portion (sec, e.g., RCE in FIG. 6). For example, the connection portion (see, e.g., RCE in FIG. 6) of the detecting electrodes RE may be disposed to intersect between the driving electrodes TE adjacent to each other. Accordingly, a side of each of the detecting electrodes RE may extend from the first area TSA1 to the second area TSA2, and another side of each of the detecting electrodes RE may extend from the first area TSA1 to the third area TSA3.

The detecting electrodes RE may include multiple first detecting electrodes RE1 disposed in the first area TSA1, multiple second detecting electrodes RE2 disposed in the second area TSA2, and multiple third detecting electrodes RE3 disposed in the third area TSA3. The detecting electrodes RE disposed in each row (see, e.g., each R1 to R7 in FIG. 4) may be electrically connected to each other through the above-described connection portion (sec. e.g., RCE in FIG. 6). For example, the detecting electrodes RE disposed in a first row (sec, e.g., R1 in FIG. 4) of the first area TSA1 may be electrically connected to the detecting electrodes RE disposed in a first row (see, e.g., R1 in FIG. 4) of the second area TSA2 and the detecting electrodes RE disposed in a first row (sec, e.g., R1 in FIG. 4) of the third area TSA3. Accordingly, the detecting electrodes RE may be disposed to extend in the direction (e.g., the first direction DR1) perpendicular to the first bending axis BA1 within the touch area TSA. For example, the detecting electrodes RE may be disposed to extend in the horizontal direction of the display panel 100 (or the first direction DR1).

The driving electrodes TE in the touch area TSA may be electrically connected to the pad portions 210, 220, and 230 through multiple driving lines TL. The driving lines TL may include multiple first driving lines TL1 connecting the first driving electrodes TE1 disposed in the first area TSA1 to the first pad portion 210, multiple second driving lines TL2 connecting the second driving electrodes TE2 disposed in the second area TSA2 to the second pad portion 220, and multiple third driving lines TL3 connecting the third driving electrodes TE3 disposed in the third area TSA3 to the third pad portion 230. For example, the first driving pad portion of the first pad portion 210 may be electrically connected to the first driving electrodes TE1 disposed in the first area TSA1 through the first driving lines TL1. The second driving pad portion of the second pad portion 220 may be electrically connected to the second driving electrodes TE2 disposed in the second area TSA2 through the second driving lines TL2. The third driving pad portion of the third pad portion 230 may be electrically connected to the third driving electrodes TE3 disposed in the third area TSA3 through the third driving lines TL3.

The driving electrodes TE in each column (see, e.g., each C1 to C7 in FIG. 4) may be connected to each of the driving lines TL in a one-to-one manner. For example, a driving line TL may be allocated to each column of the driving electrodes TE, and the allocated driving line TL may transfer driving signals output from the pad portions 210, 220, and 230 to the driving electrodes TE corresponding to a column.

The first driving electrodes TE1 disposed in the first area TSA1 may be connected to the first pad portion 210 through the first driving lines TL1. The first driving lines TL1 may be disposed between the first area TSA1 and the pad portions 210, 220, and 230.

The first detecting electrodes RE1 disposed in the first area TSA1 may be connected to the first pad portion 210 through the detecting lines RL. The detecting lines RL may extend through the display area (e.g., an active area) and may be connected to the first pad portion 210. In the first area TSA1, the first detecting electrodes RE1 in each row may be connected to each of the detecting lines RL in a one-to-one manner. The first detecting electrodes RE1 in each row may include a detecting contact portion CTA2 and may be connected to the detecting line RL through the detecting contact portion CTA2. For example, in each row of the first detecting electrodes RE1, one (or at least one) of the first detecting electrodes RE1 may include a detecting contact portion CTA2 connected to the detecting line RL. In case that the touch area TSA includes detecting electrodes RE arranged in 7 rows, the first area TSA1 may include 7 detecting contact portions CTA2. It is illustrated in FIG. 4 that the touch area TSA includes the detecting electrodes RE arranged in 7 rows and 7 detecting contact portions CTA2, but the disclosure is not limited thereto.

The second driving electrodes TE2 disposed in the second area TSA2 may be connected to the second pad portion 220 through the second driving lines TL2. The second driving lines TL2 may extend through the display area (e.g., the active area) and may be connected to the second pad portion 220. In the second area TSA2, the second driving electrodes TE2 in each column may be connected to each of the second driving lines TL2 in a one-to-one manner. The second driving electrodes TE2 in each column may include a driving contact portion CTA1 and may be connected to the second driving line TL2 through the driving contact portion CTA1. For example, in each column of the second driving electrodes TE2, one of the second driving electrodes TE2 may include a driving contact portion CTA1 connected to a second driving line TL2. In case that the second area TSA2 includes second driving electrodes TE2 arranged in 7 columns, the second area TSA2 may include 7 driving contact portions. It is illustrated in FIG. 4 that the second area TSA2 includes the second driving electrodes TE2 arranged in 7 columns and 7 driving contact portions CTA1, but the disclosure is not limited thereto.

The second area TSA2 may include multiple driving contact portions CTA1 connecting the second driving electrodes TE2 in each column and the second driving lines TL2. Each of the driving contact portions CTA1 may be connected to the second driving electrodes TE2 in each column in a one-to-one manner, and distances between the first boundary portion PA1 between the first area TSA1 and the second area TSA2 and the driving contact portions CTA1 connected to the second driving electrode TE2 in each column may be all different. A position of the driving contact portion CTA1 may be designed according to distances between the first boundary portion PA1 and the second driving electrodes TE2 in each column. For example, the distances between the first boundary portion PA1 and the driving contact portions CTA1 connected to the second driving electrodes TE2 in each column may increase from a first driving contact portion connected to the second driving electrodes TE2 in a first column C1 closest to the first boundary portion PA1 (in the first direction DR1) toward an n-th driving contact portion CTA1 connected to the second driving electrodes TE2 in an n-th column (see, e.g., C7 in FIG. 4) farthest from the first boundary portion PA1 (in the first direction DR1). For example, in the second area TSA2 of FIG. 4, a distance between the first boundary portion PA1 and the first driving contact portion CTA1 in the first column C1 may be the shortest, and a distance between the first boundary portion PA1 and the driving contact portion CTA1 in the seventh column C7 may be the longest.

The third driving electrodes TE3 disposed in the third area TSA3 may be connected to the third pad portion 230 through the third driving lines TL3. The third driving lines TL3 may extend through the display area and may be connected to the third pad portion 230. In the third area TSA3, the third driving electrodes TE3 in each column may be connected to each of the third driving lines TL3 in a one-to-one manner. The third driving electrodes TE3 in each column may include a driving contact portion CTA3 and may be connected to a third driving line TL3 through the driving contact portion CTA3. For example, in each column of the third driving electrodes TE3, one of the third driving electrodes TE3 may include a driving contact portion CTA3 connected to a third driving line TL3. In case that the third area TSA3 includes third driving electrodes TE3 arranged in 7 columns, the third area TSA3 may include 7 driving contact portions CTA3. It is illustrated in FIG. 4 that the third area TSA3 includes the third driving electrodes TE3 arranged in the 7 columns and 7 driving contact portions CTA3, but the disclosure is not limited thereto.

The third area TSA3 may include multiple driving contact portions CTA3 connecting the third driving electrodes TE3 in each column and the third driving lines TL3. Each of the driving contact portions CTA3 may be connected to the third driving electrodes TE3 in each column in a one-to-one manner, and distances between a second boundary portion PA2 between the first area TSA1 and the third area TSA3 and the driving contact portions CTA3 connected to the third driving electrode TE3 in each column may be all different. A position of the driving contact portion CTA3 may be designed according to distances between the second boundary portion PA2 and the third driving electrodes TE3 in each column. For example, the distances between the second boundary portion PA2 and the driving contact portions CTA3 connected to the third driving electrodes TE3 in each column may increase from a first driving contact portion connected to the third driving electrode TE3 in a first column C1 closest to the second boundary portion PA2 (in the first direction DR1) toward an n-th driving contact portion CTA3 connected to the third driving electrodes TE3 in an n-th column (see, e.g., C7 in FIG. 4) farthest from the second boundary portion PA2 (in the first direction DR1). For example, in the third area TSA3 of FIG. 4, a distance between the second boundary portion PA2 and the first driving contact portion CTA3 in the first column C1 may be the shortest, and a distance between the second boundary portion PA2 and the driving contact portion CTA3 in the seventh column C7 may be the longest.

Figure 5:
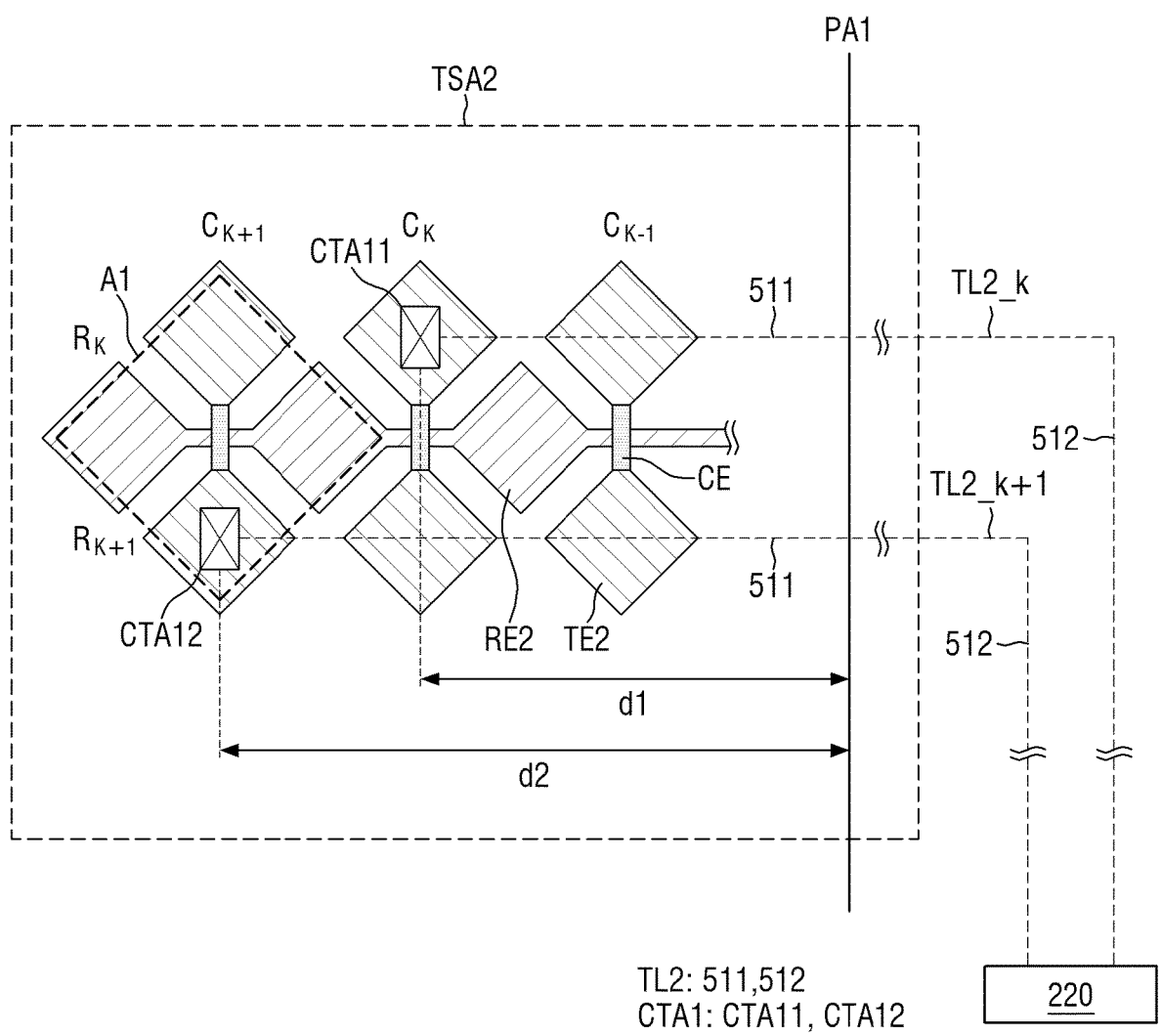
FIG. 5 is a schematic enlarged view of a portion of a second area illustrated in FIG. 4.

FIG. 5 is a schematic enlarged view of a portion of the second area TSA2 illustrated in FIG. 4.

Referring to FIG. 5, each of the second driving lines TL2 connecting the second driving electrodes TE2 disposed in the second area TSA2 to the second pad portion 220 may include a first line section 511 connected to one of the second driving electrodes TE2 and extend in the first direction (see, e.g., the DR1 in FIG. 4 or the horizontal direction of the display panel 100), and a second line section 512 bent from an end of the first line section 511 and extend in the second direction (see, e.g., DR2 in FIG. 4 or the vertical direction of the display panel 100) generally perpendicular to the first direction and connected to the second pad portion 220 (i.e., the second driving pad portion of the second pad portion 220). For example, each of the second driving lines TL2 may include the first line section 511 connected to the driving contact portion CTA1 formed on a second driving electrode TE2 in each column and extending in the first direction (see, e.g., DR1 in FIG. 4 or the horizontal direction of the display panel 100) from the driving contact portion CTA1, and the second line section 512 bent from an end of the first line section 511, extending in the second direction (sec, e.g., DR2 in FIG. 4 or the vertical direction of the display panel 100), and connected to the second pad portion 220.

Although not illustrated, a structure of each of the third driving lines TL3 connecting the third driving electrodes TE3 disposed in the third area TSA3 to the third pad portion 230 and a structure of each of the second driving lines TL2 may be substantially the same or similar. Therefore, a description of the structure and driving method of the third driving electrodes TE3 will not be repeated.

A length of the first line section 511 of each of the second driving lines TL2 may be designed according to a distance between the first boundary portion PA1 and the second driving electrode TE2 in each column. For example, in FIG. 5. CTA11 may be a k-th driving contact portion connecting the driving electrode TE in k-th column $C_K$ and the second driving line TL2, and CTA12 may be a k+1-th driving contact portion connecting the driving electrode TE in k+1-th column $C_{K+1}$ and the second driving line TL2. A length d1 of a portion of the first line section 511, which is a portion of the second driving line TL2_k extending horizontally from the k-th driving contact portion CTA11 to the first boundary portion PA1, may be less than a length d2 of a portion of the first line section 511, which is a portion of the second driving line TL2_k+1 extending horizontally from the k+1-th driving contact portion CTA12 to the first boundary line PA1.

Figure 6:
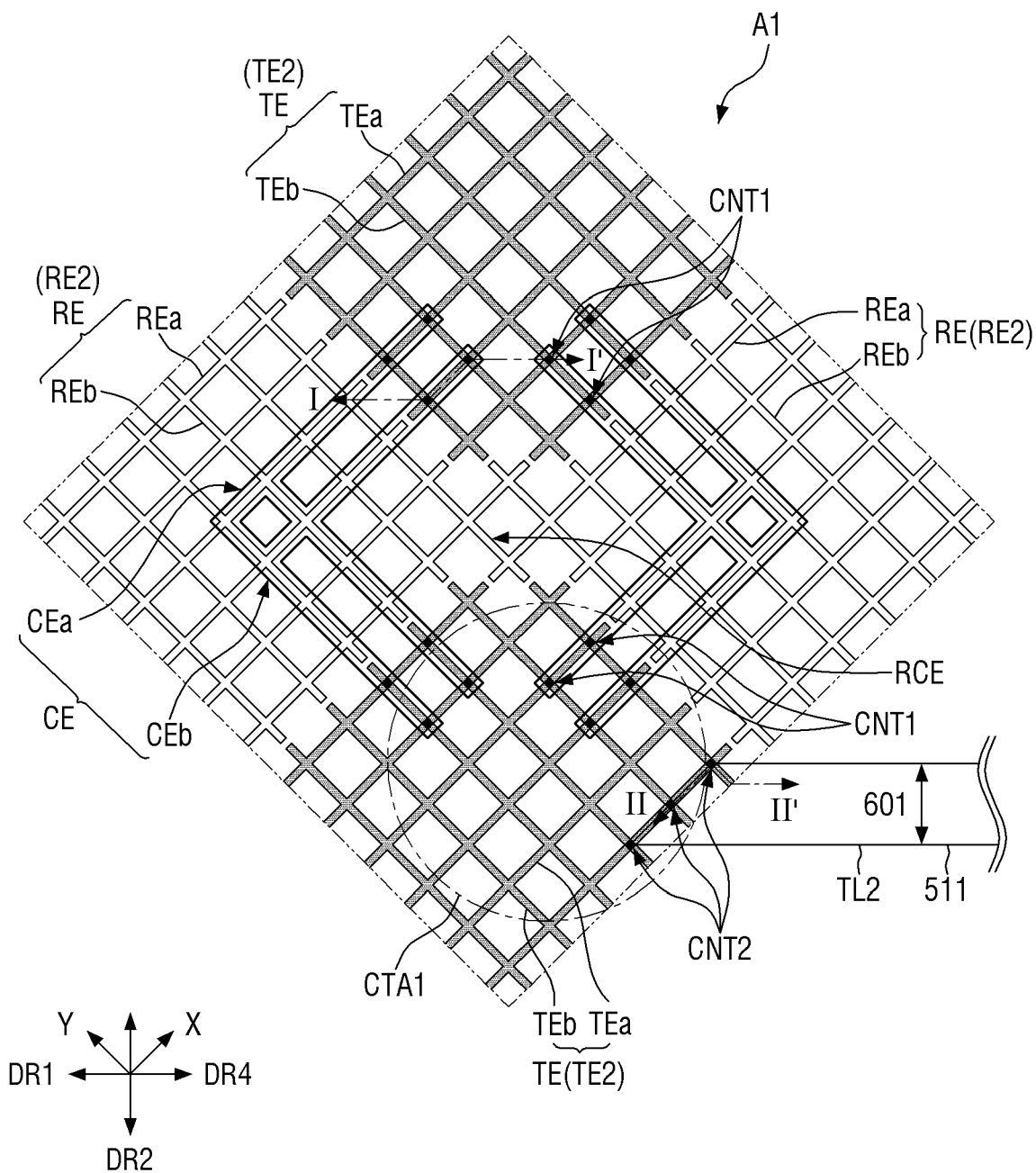
FIG. 6 is a schematic enlarged view of touch sensor electrodes disposed in area A1 illustrated in FIG. 5.
Figure 7:
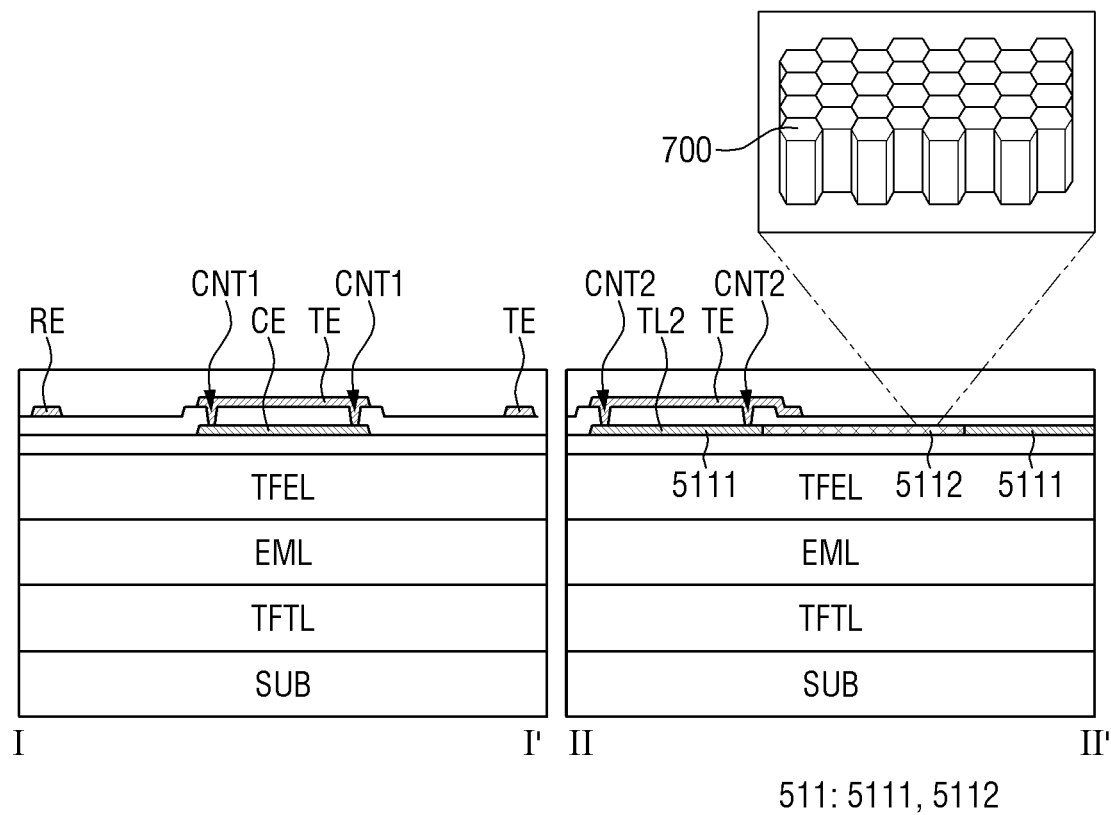
FIG. 7 is a schematic cross-sectional view illustrating a display panel taken along lines I-I' and II-II' illustrated in FIG. 6 according to an embodiment.

FIG. 6 is a schematic enlarged view of touch sensor electrodes disposed in area A1 illustrated in FIG. 5. FIG. 7 is a schematic cross-sectional view illustrating the display panel 100 taken along lines I-I' and II-II' illustrated in FIG. 6 according to an embodiment. Hereinafter, a structure of the touch sensor electrodes (e.g., the driving electrode TE and the detecting electrode RE) according to an embodiment of the disclosure will be described in more detail with reference to FIGS. 6 and 7.

In the description of FIGS. 6 and 7, a "driving electrode TE" may be the second driving electrode TE2 formed in the second area TSA2, but the first driving electrode TE1 formed in the first area TSA1, the third driving electrode TE3 formed in the third area TSA3, and the second driving electrode TE2 formed in the second area TSA2 may be similar or substantially the same. Therefore, a description of the first driving electrode TE1 formed in the first area TSA1 and the third driving electrode TE3 formed in the third area TSA3 will not be repeated.

In the description of FIGS. 6 and 7, a "detecting electrode RE" may be the second detecting electrode RE2 formed in the second area TSA2, but the first detecting electrode RE1 formed in the first area TSA1, the third detecting electrode RE3 formed in the third area TSA3, and the second detecting electrode RE2 formed in the second area TSA2 may be similar or substantially the same. Therefore, a description of the first detecting electrode RE1 formed in the first area TSA1 and the third detecting electrode RE3 formed in the third area TSA3 will not be repeated.

In FIG. 6, a fifth direction X may be a direction between the fourth direction DR4 and an opposite direction of the second direction DR2, and a sixth direction Y may be a direction between the first direction DR1 and the opposite direction of the second direction DR2. Referring to FIG. 6, multiple driving electrodes TE may be arranged in the first direction DR1 and the second direction DR2. The driving electrodes TE may be spaced apart from each other in the first direction DR1 and the second direction DR2. The driving electrodes TE adjacent to each other in the second direction DR2 may be electrically connected to each other through a bridge electrode CE.

Multiple detecting electrodes RE may extend in the first direction DR1 (e.g., the horizontal direction of the display panel 100) and may be spaced apart from each other in the second direction DR2 (e.g., the vertical direction of the display panel 100). The detecting electrodes RE may be arranged in the first direction DR1 and the second direction DR2, and the detecting electrodes RE adjacent to each other in the first direction DR1 may be electrically connected to each other through a connection portion RCE. For example, the connection portion RCE of the detecting electrodes RE may cross between the driving electrodes TE adjacent to each other.

Multiple bridge electrodes CE, and the driving electrodes TE and the detecting electrodes RE may be disposed on different layers. The bridge electrode CE may include a first portion CEa and a second portion CEb. For example, the second portion CEb of the bridge electrode CE may be connected to the driving electrode TE disposed on a side through a first contact hole CNT1 and extend in the sixth direction Y. The first portion CEa of the bridge electrode CE may be bent from the second portion CEb in an area overlapping the detecting electrode RE in a plan view and extend in the fifth direction X, and may be connected to the driving electrode TE disposed on another side through the first contact hole CNT1. For example, each of the bridge electrodes CE may connect the driving electrodes TE adjacent to each other in the second direction DR2.

According to an embodiment, the driving electrodes TE and the detecting electrodes RE may be formed in a mesh structure, a net structure, or the like in a plan view.

Each of the driving electrodes TE may include a first portion TEa extending in the fifth direction X and a second portion TEb extending in the sixth direction Y. Each of the detecting electrodes RE may include a first portion REa extending in the fifth direction X and a second portion REb extending in the sixth direction Y.

According to another embodiment, the driving electrodes TE and the detecting electrodes RE may be formed in a plane instead of the mesh structure or the net structure in a plan view, and the driving electrodes TE and the detecting electrodes RE may include a transparent conductive material having high light transmittance, such as indium tin oxide (ITO), indium zinc oxide (IZO), or the like.

The second driving electrodes TE2 in each column may include a driving contact portion CTA1. The driving contact portion CTA1 may be a portion of the second driving electrodes TE2 in each column connected to the second driving line TL2 through a second contact hole CNT2. For example, a portion of the second driving electrode TE2 and a portion of the first line section 511 of the second driving line TL2 that form the driving contact portion CTA1 may overlap each other in a plan view, and the second contact hole CNT2 may be formed in the overlapped area. It is illustrated in FIG. 6 that a portion of the first line section 511 of the second driving line TL2 overlaps a portion of the second driving electrode TE2 having the mesh structure in a plan view, but an overlapped area of the first line section 511 and the second driving electrode TE2 is not limited in the disclosure.

In the third area TSA3, the third driving electrodes TE3 in each column may include a driving contact portion CTA3. In the third area TSA3, the driving contact portion CTA3 may a portion of the third driving electrodes TE3 in each column connected to the third driving line TL3 through the second contact hole CNT2. For example, in the third area TSA3, a portion of the third driving electrode TE3 and a portion of the first line section 511 of the third driving line TL3 that form the driving contact portion CTA3 may overlap each other in a plan view, and the second contact hole CNT2 may be formed in the overlapped area.

As illustrated in FIG. 7, according to an embodiment, the second driving line TL2 and the bridge electrode CE connecting the adjacent driving electrodes TE to each other may be formed on a same layer. The second driving line TL2 may include a columnar conductor 700 in at least a portion of the second driving line TL2. According to an embodiment, the first line section 511 of the second driving line TL2 may include a first sub-section 5112 including the columnar conductor 700 and a second sub-section 5111 that does not include the columnar conductor 700. The second sub-section 5111 may be a section including a non-columnar conductor.

The first sub-section 5112 of the second driving line TL2 including the columnar conductor 700 may extend in the horizontal direction of the display panel 100 in the second area TSA2 extending from the first area TSA1. The first sub-section 5112 may generate a change in resistance of the second driving line TL2 in case that the state of the display device 10 is changed. For example, as the first sub-section 5112 is disposed adjacent to the first bending axis (sec, e.g., BA1 in FIG. 4) on which a portion of the second area TSA2 is bent in case that the display device 10 changes from the first state to the second state, an arrangement of the columnar conductors 700 may change. Change of the arrangement (e.g., ligament movement) of the columnar conductors 700 may cause a change in resistance of the second driving line TL2. Similarly, as the first sub-section 5112 is disposed adjacent to the first bending axis (see, e.g., BA1 in FIG. 4) on which a portion of the second area TSA2 is bent in case that the display device 10 changes from the second state to the first state, the arrangement of the columnar conductors 700 may change. Change of the arrangement of the columnar conductors 700 may cause a change in resistance of the second driving line TL2.

Although not illustrated, the third driving line TL3 may also include a first sub-section 5112 including the columnar conductors 700 similarly to the second driving line TL2, and the first sub-section 5112 may generate a change in resistance of the third driving line TL3 in case that the state of the display device 10 is changed. For example, as the first sub-section 5112, which is a portion of the third driving line TL3, is disposed adjacent to the second bending axis (sec, e.g., BA2 in FIG. 4) on which a portion of the third area TSA3 is bent in case that the display device 10 changes from the first state to the second state, an arrangement of the columnar conductors 700 may change. Changes of the arrangement (e.g., ligament movement) of the columnar conductors 700 may cause a change in resistance of the third driving line TL3. Similarly, as the first sub-section 5112, which is a portion of the third driving line TL3, is disposed adjacent to the second bending axis (sec, e.g., BA2 in FIG. 4) on which a portion of the third area TSA3 is bent in case that the display device 10 changes from the second state to the first state, the arrangement of the columnar conductors 700 may change. Changes of the arrangement of the columnar conductors 700 may cause a change in resistance of the third driving line TL3.

The touch control circuit according to an embodiment may detect a change in resistance of the second driving lines TL2 due to change of the arrangement of the columnar conductors 700 through the second pad portion 220, and may determine a position of the first bending axis (see, e.g., BA1 in FIG. 4) based on the detected change in resistance. The touch control circuit may determine an active area of a touch detection device and/or an active area (i.e., a display area) of the display device 10 based on the determined position of the first bending axis BA1.

The touch control circuit according to an embodiment may detect a change in resistance of the third driving lines TL3 due to change of the arrangement of the columnar conductors 700 through the third pad portion 230, and may determine a position of the second bending axis (see, e.g., BA2 in FIG. 4) based on the detected change in resistance. The touch control circuit may determine an active area of the touch detection device and/or an active area (i.e., a display area) of the display device 10 based on the determined position of the second bending axis BA2. The active area of the touch detection device may be an area in which a touch detection function is activated.

Figure 8:
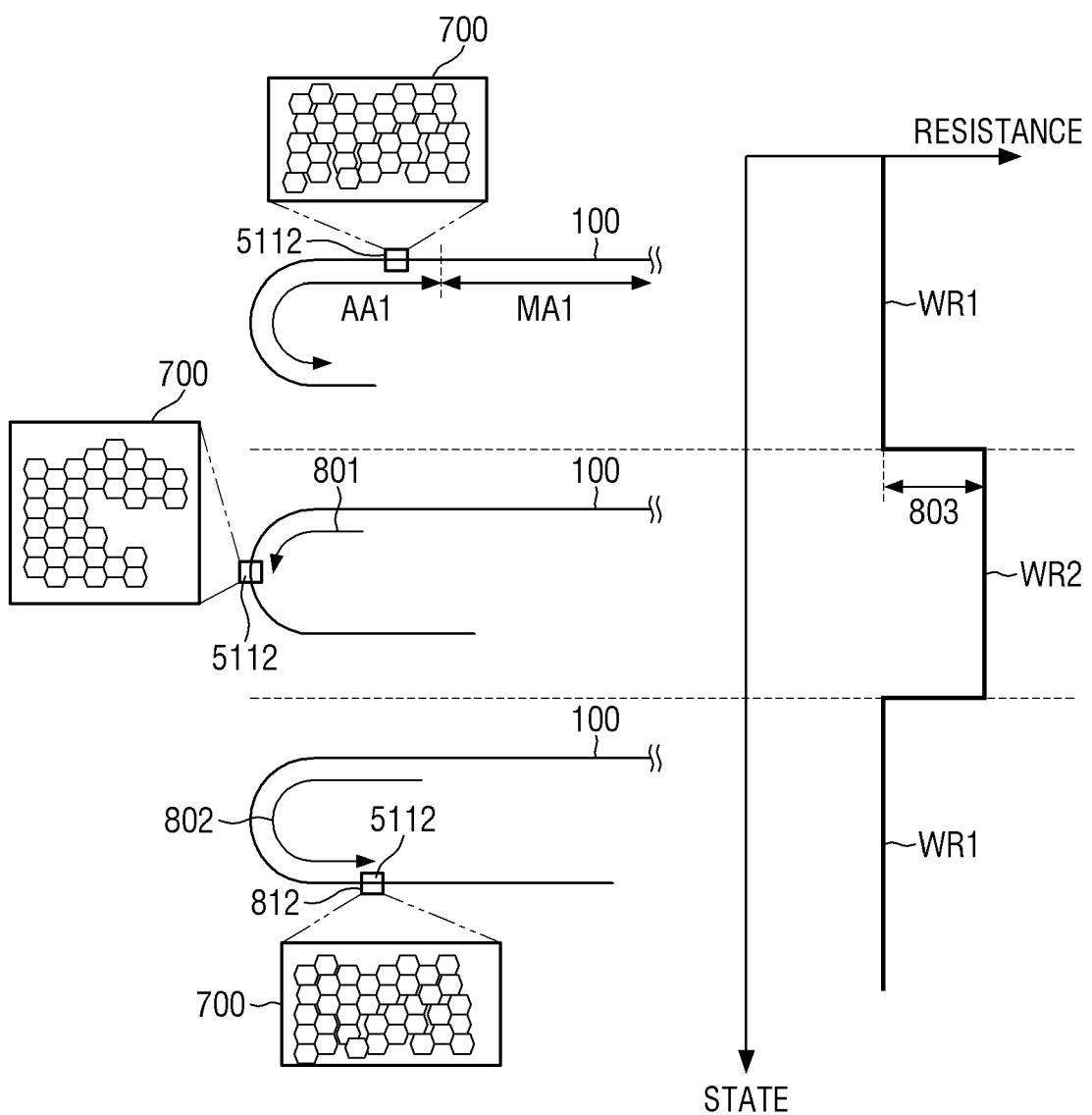
FIG. 8 is a schematic view illustrating a method of determining a bending axis by using a columnar conductor in a touch detection device according to an embodiment.

FIG. 8 is a schematic view illustrating a method of determining a bending axis by using a columnar conductor 700 in a touch detection device according to an embodiment. FIG. 8 schematically illustrates a process of transitioning the display device 10 from a first state (e.g., a maximum expansion state) to a second state (e.g., a maximum reduction state). For example, FIG. 8 sequentially illustrates a first state in which substantially an entire area of the second area TSA2 (or the first auxiliary area AA1) is disposed on the front surface of the display device 10, a third state (e.g., an intermediate state) in which a portion of the second area TSA2 is bent and disposed adjacent to a side surface of the display device 10, and a second state in which substantially an entire area of the second area TSA2 is disposed adjacent to the rear surface of the display device 10.

Referring to FIG. 8, in case that the display device 10 is in the first state, the first sub-section 5112 of the second driving line TL2 including the columnar conductors 700 may be disposed on the front surface of the display panel 100 and maintain a flat state. Accordingly, a gap between the columnar conductors 700 of the first sub-section 5112 may be relatively narrow, and the corresponding second driving line TL2 may have a first resistance WR1.

In case that the display device 10 transitions from the first state to the third state, the first sub-section 5112 of the second driving line TL2 including the columnar conductors 700 may move in a direction indicated by arrow 801. Accordingly, as the first sub-section 5112 is disposed adjacent to the first bending axis (see, e.g., BA1 in FIG. 4), the first sub-section 5112 may maintain a bent state with a curvature (e.g., a designated curvature). Accordingly, a gap between the columnar conductors 700 of the first sub-section 5112 may be relatively increased by change of the arrangement (e.g., ligament movement) of the columnar conductors 700. The touch control circuit may determine whether a change amount 803 of the second driving line TL2 exceeds a threshold value (e.g., a designated threshold value) in case that a resistance value of the second driving line TL2 increases from the first resistance WR1 to a second resistance WR2. In case that the change amount exceeds the threshold value 803, the touch control circuit may determine that the second driving line TL2 is disposed adjacent to the first bending axis BA1.

In case that the display device 10 transitions from the third state to the second state, the first sub-section 5112 of the second driving line TL2 including the columnar conductors 700 may move in a direction indicated by arrow 802. Accordingly, the first sub-section 5112 may be disposed adjacent to the rear surface of the display panel 100 and maintain a flat state. Accordingly, a gap between the columnar conductors 700 of the first sub-section 5112 may be relatively narrow, and the corresponding second driving line TL2 may have first resistance WR1.

In case that the display panel 100 of the display device 10 operates in a slide-in mode (i.e., transitions from the first state to the second state via the third state), the touch control circuit may detect resistance of each of the second driving lines TL2, and may determine a location of the first bending axis BA1 based on a detection that a change in resistance of the second driving line TL2 being equal to or greater than a threshold value. The touch control circuit may adjust an active area and a non-active area based on the determined first bending axis BA1. The touch control circuit may perform control so that a portion of the second area TSA2 does not perform a touch operation by blocking a driving signal to the second driving electrodes TE2 determined as the non-active area. For example, the touch control circuit may supply a touch driving signal to driving lines (see, e.g., TL in FIG. 4) corresponding to the adjusted active area, and may not supply the touch driving signal to driving lines corresponding to the non-active area. Similar to the operation of the touch control circuit, the display driving portion may adjust the active area and the non-active area of the display panel 100 based on a detection that a change in resistance of the second driving line TL2 being equal to or greater than a threshold value.

In case that the display panel 100 of the display device 10 operates in the slide-in mode (i.e., transitions from the first state to the second state via the third state), the touch control circuit may detect resistance of each of the third driving lines TL3, and may determine a location of the second bending axis BA2 based on a detection that a change in resistance of the third driving line TL3 being equal to or greater than a threshold value. The touch control circuit may adjust an active area and a non-active area of the touch detection device based on the determined second bending axis BA2. The touch control circuit may perform control so that a portion of the third area TSA3 does not perform a touch operation by blocking a driving signal to the third driving electrodes TE3 determined as the non-active area.

In case that the display panel 100 of the display device 10 operates in a slide-out mode (i.e., transitions from the second state to the first state via the third state), the touch control circuit may detect resistance of each of the second driving lines TL2, and may determine a location of the first bending axis BA1 based on a detection that a change in resistance of the second driving line TL2 being equal to or greater than a threshold value. The touch control circuit may adjust an active area and a non-active area of the touch detection device based on the determined first bending axis BA1. The touch control circuit may perform control so that a portion of the second area TSA2 that has been inactivated detects a touch by re-supplying the blocked driving signal to the second driving electrodes TE2 determined as the active area. For example, the touch control circuit may supply a touch driving signal to driving lines corresponding to the adjusted active area, and may not supply the touch driving signal to driving lines corresponding to the adjusted non-active area. Similar to the operation of the touch control circuit, the display driving portion may adjust the active area and the non-active area of the display panel 100 based on a detection that a change in resistance of the second driving line TL2 being equal to or greater than a threshold value.

In case that the display panel 100 of the display device 10 operates in the slide-out mode (i.e., transitions from the second state to the first state via the third state), the touch control circuit may detect resistance of each of the third driving lines TL3, and may determine a location of the second bending axis BA2 based on a detection that a change in resistance of the third driving line TL3 being equal to or greater than a threshold value. The touch control circuit may adjust an active area and a non-active area of the touch detection device based on the determined second bending axis BA2. The touch control circuit may perform control so that a portion of the third area TSA3 that has been inactivated detects a touch by re-supplying the blocked driving signal to the third driving electrodes TE3 determined as the active area.

Figure 9:
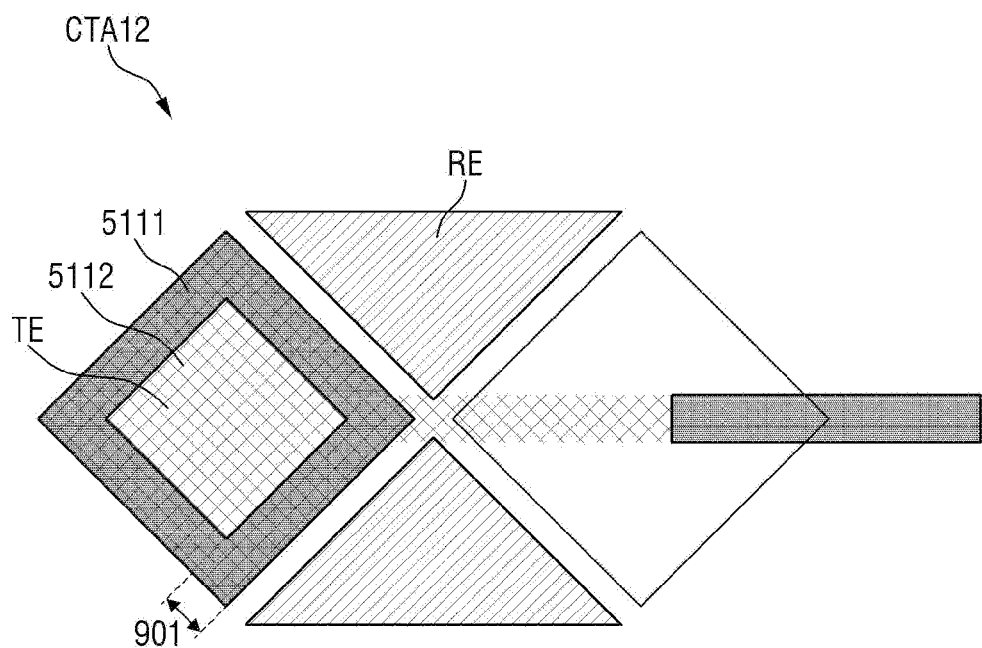
FIG. 9 is a schematic plan view illustrating a driving contact portion positioned in a portion of a second area according to an embodiment.
Figure 10:
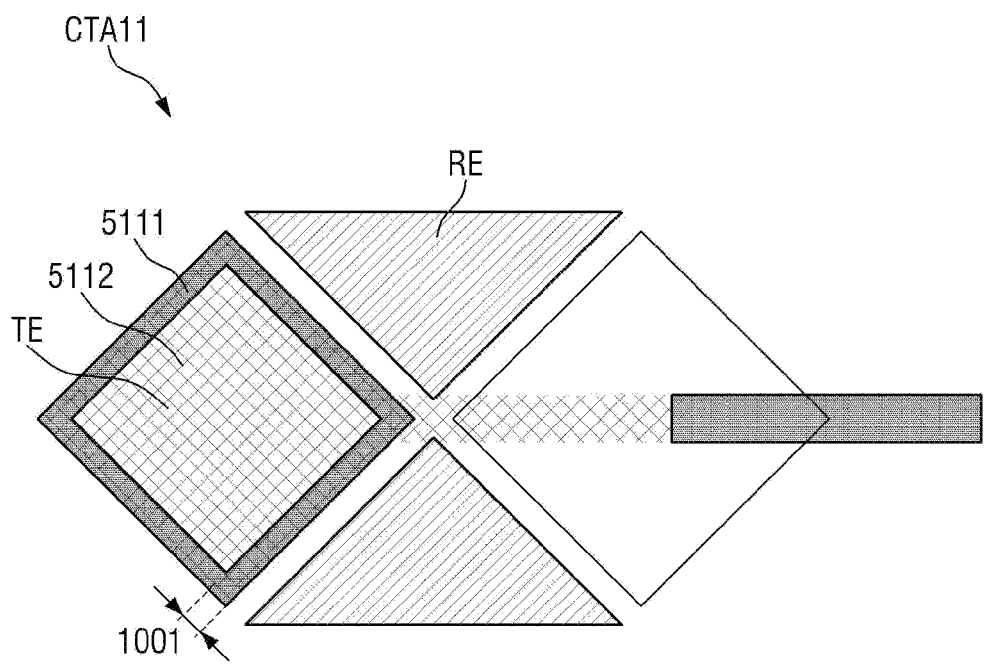
FIG. 10 is a schematic plan view illustrating a driving contact portion positioned in another portion of a second area according to an embodiment.

FIG. 9 is a schematic plan view illustrating a driving contact portion CTA12 positioned in a portion of a second area TSA2 according to an embodiment. FIG. 10 is a schematic plan view illustrating a driving contact portion positioned CTA11 in another portion of a second area TSA2 according to an embodiment. Hereinafter, to describe a structure of the driving contact portion CTA1 in a plan view, the structures of the first sub-section 5112 including the columnar conductor 700 and the second sub-section 5111 that does not include the columnar conductor 700 will be described with reference to FIGS. 9 and 10.

In the description of FIGS. 9 and 10, the "driving contact portion" may be a driving contact portion formed in the second area TSA2, but a driving contact portion formed in the third area TSA3 and the driving contact portion formed in the second area TSA2 may be similar or substantially the same. Therefore, a description of the driving contact portion formed in the third area TSA3 will not be repeated.

Referring to FIGS. 9 and 10, the first sub-section 5112 including the columnar conductor 700 in each of the second driving lines TL2 may be formed to extend to an area overlapping the driving electrode TE in a plan view. For example, as illustrated, each of multiple driving contact portions CTA (CTA11 and CTA12) disposed in the second area TSA2 may include an overlapping portion overlapping the driving electrode TE in a plan view. The overlapping portion may include a first sub-section 5112 (or a first overlapping portion) that is disposed to overlap the second driving electrode TE2 in a plan view and is a portion of the first line section 511 including the columnar conductors 700, and a second sub-section 5111 (or a second overlapping portion) disposed to overlap the second driving electrode TE2 in a plan view and formed to surround an edge of the first overlapping portion 5112. The second overlapping portion 5111 may be a non-columnar conductor section that does not include the columnar conductors 700.

Although not illustrated, each of the driving contact portions (see, e.g., CTA3 in FIG. 4) disposed in the third area TSA3 may include an overlapping portion overlapping the driving electrode TE in a plan view. The overlapping portion may include a first overlapping portion that is disposed to overlap the third driving electrode TE3 in a plan view and is a portion of the first sub-section 5112 including the columnar conductors 700, and a second overlapping portion disposed to overlap the third driving electrode TE3 in a plan view and formed to surround an edge of the first overlapping portion. The second overlapping portion may be a non-columnar conductor section that does not include the columnar conductors 700.

According to an embodiment, an area of the second overlapping portion 5111 that does not include the columnar conductors 700 in the driving contact portions CTA (CTA11 and CTA12) may be designed to compensate for a difference in touch sensitivity due to a difference in length between the second driving lines TL2. For example, an RC deviation (e.g., resistance deviation and/or capacitance deviation) may exist for each driving line due to the difference in length between the second driving lines TL2. According to the disclosure, in order to compensate for such a deviation, the area occupied by the second overlapping portion 5111 within the driving contact portions CTA (CTA11 and CTA12) may be differentially designed.

According to an embodiment, the area occupied by the second overlapping portion 5111 within the driving contact portions CTA (CTA11 and CTA12) may be differentially designed according to distances between the first boundary portion PA1 between the first area TSA1 and the second area TSA2 and the driving contact portions CTA (CTA11 and CTA12). For example, the area occupied by the second overlapping portion 5111 within the driving contact portions CTA (CTA11 and CTA12) may be differentially designed according to a distance between the first area TSA1 and each of the columns of the second driving electrodes TE2. For example, the area occupied by the second overlapping portion 5111 may increase from a first driving contact portion connected to the second driving electrodes TE2 of a first column closest to the first boundary portion PA1 toward an n-th driving contact portion connected to the second driving electrodes TE2 of an n-th column farthest from the first boundary portion PA1. For example, in each of the driving contact portions CTA1 formed in the second area TSA2, a width of the second overlapping portion 5111 may increase toward the n-th driving contact portion connected to the second driving electrodes TE2 of the n-th column farthest from the first boundary portion PA1 from the first driving contact portion connected to the second driving electrodes TE2 of the first column closest to the first boundary portion PA1.

FIG. 9 schematically illustrates a driving contact portion (see, e.g., CTA12 in FIG. 5) connected to the second driving electrodes TE2 of a k+1-th column. The driving contact portion connected to the second driving electrodes TE2 of the k+1-th column illustrated in FIG. 9 may be positioned farther from the first boundary portion PA1 (sec, e.g., PA1 in FIG. 5) than the driving contact portion (see, e.g., CTA11 in FIG. 5) connected to the second driving electrodes TE2 of a k-th column illustrated in FIG. 10. As illustrated in FIG. 9, the driving contact portion CTA12 connected to the second driving electrodes TE2 of the k+1-th column may include a first overlapping portion 5112 including the columnar conductors 700 and disposed at an end of the first line section 511, and a second overlapping portion 5111 that is disposed to surround an edge of the first overlapping portion 5112 and does not include the columnar conductors 700. The first overlapping portion 5112 may have a mesh structure to overlap the driving electrode TE as the driving electrode TE has the mesh structure as described in FIG. 6 in a plan view. In the driving contact portion CTA12 connected to the second driving electrodes TE2 of the k+1-th column, the second overlapping portion 5111 may have greater first width 901.

FIG. 10 schematically illustrates a driving contact portion (see, e.g., CTA11 in FIG. 5) connected to the second driving electrodes TE2 of a k-th column. The driving contact portion connected to the second driving electrodes TE2 of the k-th column illustrated in FIG. 10 may be positioned closer to the first boundary portion PA1 (sec, e.g., PA1 in FIG. 5) than the driving contact portion (sec, e.g., CTA12 in FIG. 5) connected to the second driving electrodes TE2 of the k+1-th column illustrated in FIG. 9. As illustrated in FIG. 10, the driving contact portion CTA11 connected to the second driving electrodes TE2 of the k-th column may include a first overlapping portion 5112 including the columnar conductors 700 and disposed at an end of the first line section 511, and a second overlapping portion 5111 that is disposed to surround an edge of the first overlapping portion 5112 and does not include the columnar conductors 700. The first overlapping portion 5112 may have a mesh structure to overlap the driving electrode TE as the driving electrode TE has the mesh structure as described in FIG. 6 in a plan view. In the driving contact portion CTA11 connected to the second driving electrodes TE2 of the k-th column, the second overlapping portion 5111 may have smaller second width 1001. The second width 1001 illustrated in FIG. 10 may be less than the first width 901 illustrated in FIG. 9 in a direction.

Figure 11:
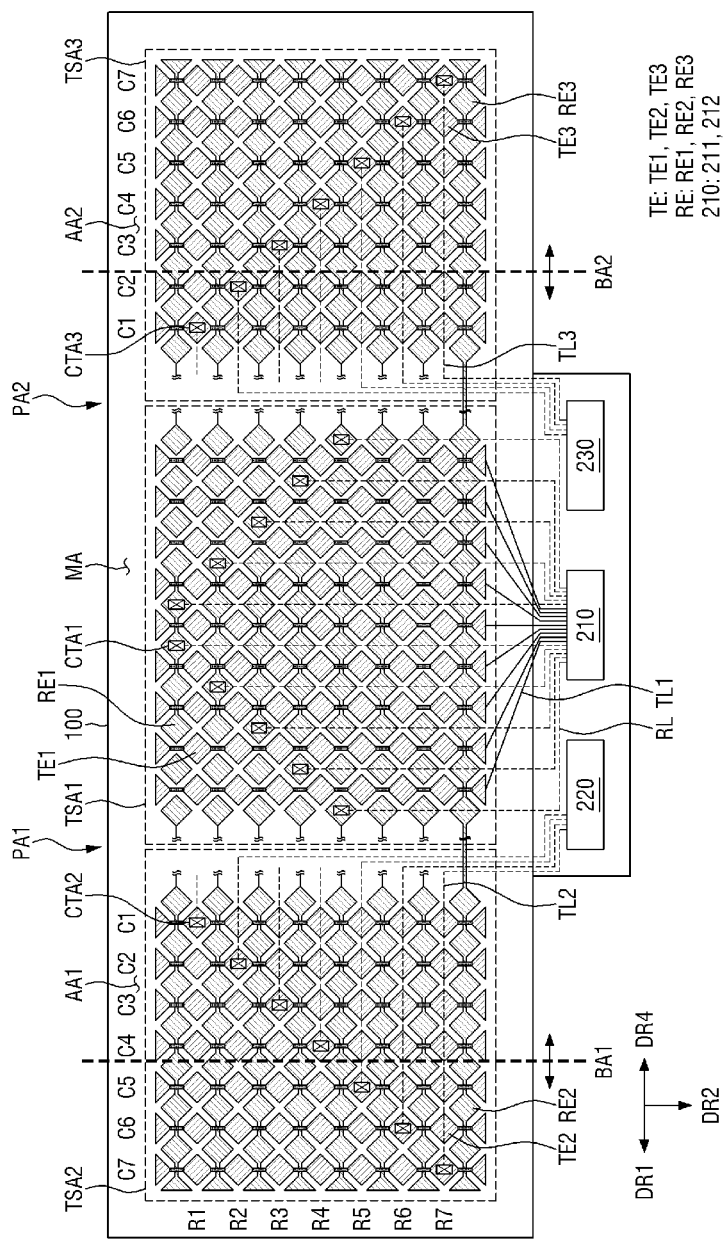
FIG. 11 is a schematic plan view illustrating a touch area and lines connected to the touch area of a display device according to another embodiment.

FIG. 11 is a schematic plan view illustrating a touch area TSA and lines connected to the touch area TSA of a display device 10 according to another embodiment.

The display device 10 illustrated in FIG. 11 and the display device 10 illustrated in FIG. 4 may be at least partially similar. Hereinafter, only components different from components of the display device 10 illustrated in FIG. 4 will be described with reference to FIG. 11. Therefore, hereinafter, components that are not described in relation to FIG. 11 will be replaced with the descriptions related to FIG. 4.

Referring to FIG. 11, the first detecting electrodes RE1 disposed in the first area TSA1 may be connected to the pad portions 210, 220, and 230 through the detecting lines RL, and may include multiple detecting contact portions CTA2 in each row. In the embodiment illustrated in FIG. 4, the first detecting electrodes RE1 in each row and each of the detecting lines RL may be connected to each other in a one-to-one manner, but in another embodiment illustrated in FIG. 11, a pair of detecting contact portions CTA1 may be provided on the first detecting electrodes RE1 in each row, and each of the pair of detecting contact portions CTA1 may connect the detecting lines RL to the first pad portion 210. In case that the touch area TSA includes detecting electrodes RE corresponding to 7 rows, the first area TSA1 may include 14 detecting contact portions CTA2. It is illustrated in FIG. 11 that the touch area TSA includes the detecting electrodes RE corresponding to the 7 rows and the 7 detecting contact portions CTA1, but the disclosure is not limited thereto. It is illustrated in FIG. 11 that the pair of detecting contact portions CTA1 is provided on the first detecting electrodes RE1 in each row, but the disclosure is not limited thereto. For example, three or more detecting contact portions CTA2 may be provided on the first detecting electrodes RE1 in each row.

According to an embodiment, a pair of detecting contact portions CTA2 connected to the first detecting electrodes RE1 in each row may be disposed symmetrically with respect to an imaginary vertical axis (not illustrated) crossing the center of the first area TSA1. According to an embodiment, lengths of the detecting lines RL connected to the pair of detecting contact portions CTA2 and connecting the detecting electrodes RE and the first pad portion 210 in the vertical direction (e.g., the second direction DR2) may be differentially designed. For example, the lengths of the detecting lines RL in the vertical direction may be designed to be greater as the detecting lines RL are closer to the imaginary vertical axis crossing the center of the first area TSA1 in the horizontal direction, and may be designed to be shorter as the detecting lines RL are further away from the virtual vertical axis in the horizontal direction. According to the disclosure, it is possible to prevent a decrease in touch sensitivity because of an increase in a width of the display device 10 having a bi-slidable form factor.

Figure 12:
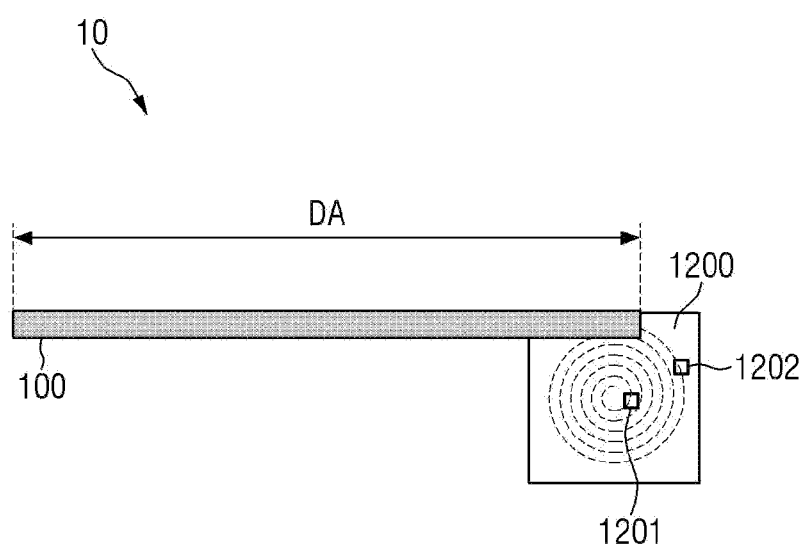
FIG. 12 is a schematic cross-sectional view illustrating a display device according to another embodiment.
Figure 13:
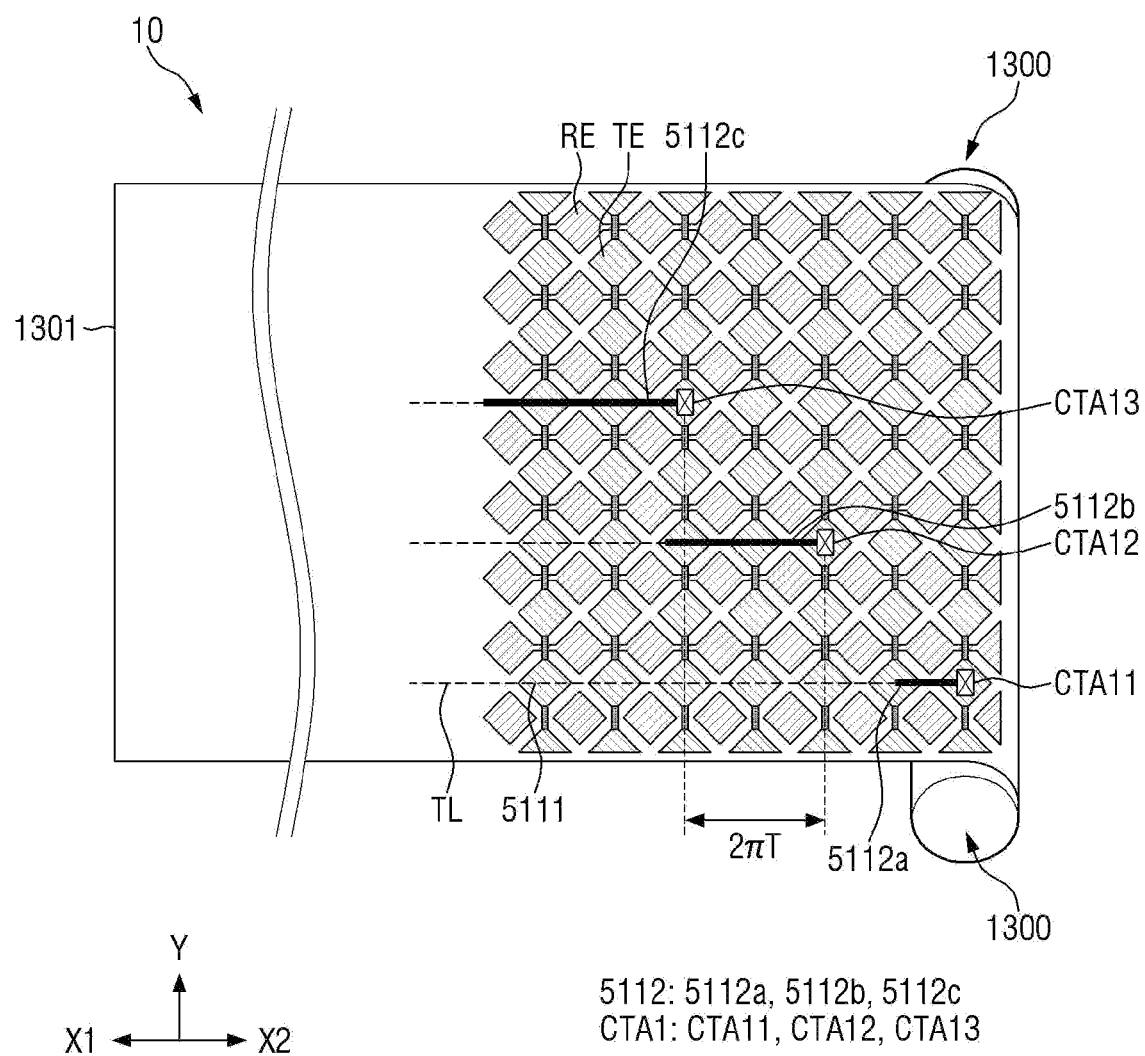
FIG. 13 is a schematic perspective view illustrating the display device illustrated in FIG. 12.

FIG. 12 is a schematic cross-sectional view illustrating a display device 10 according to another embodiment. FIG. 13 is a schematic perspective view illustrating the display device 10 illustrated in FIG. 12.

The display device 10 illustrated in FIGS. 12 and 13 and the display device 10 illustrated in FIG. 4 may be at least partially similar. Hereinafter, only components different from components of the display device 10 illustrated in FIG. 4 will be described with reference to FIGS. 12 and 13. Therefore, hereinafter, components that are not described in relation to FIGS. 12 and 13 will be replaced with the descriptions related to FIG. 4.

Referring to FIG. 12, as the display device 10 has the display panel 100 that can be curved, bent, folded, or rolled, the display area DA of the display panel 100 may be adjusted. For example, the display device 10 described with reference to FIGS. 1 to 11 may have a form factor in which a portion of the display panel 100 is curved, bent, folded, or rolled, and disposed toward the rear surface of the display panel 100, whereas the display device 10 illustrated in FIGS. 12 and 13 may be configured such that the display panel 100 is loaded inside a housing 1200 while rolled around a roller member. Such a display device 10 may have a structure of a touch area TSA and lines connected to the touch area TSA. The structure of the touch area TSA and lines connected to the touch area TSA and the structure described with reference to FIG. 4 or FIG. 11 may be similar.

However, as illustrated in FIG. 12, in case that the display panel 100 is configured to be rolled, a curvature of a first section 1201 of the display panel 100 that is relatively rolled-in earlier may be greater than a curvature of a second section 1202 of the display panel 100 that is rolled-in relatively later, in a slide-in motion in which the display panel 100 is rolled in the housing 1200. For example, while the display panel 100 is loaded inside the housing 1200 while rolled around the roller member, the first section 1201 of the display panel 100 may maintain a first curvature, and the second section 1202 of the display panel 100 may maintain a second curvature less than the first curvature. The display device 10 according to the form factor in which the display panel 100 is configured to be rolled may be configured such that the first section 1201 relatively close to a rolling axis (see, e.g., 1300 in FIG. 13) is rolled with a relatively large first curvature, and the second section 1202, which is relatively far from the rolling axis (sec, e.g., 1300 in FIG. 13) and rolled around an outer portion of the first section 1201, is rolled with the second curvature less than the first curvature.

Referring to FIG. 13, the touch area TSA may include multiple detecting electrodes RE and multiple driving electrodes TE, and the driving electrodes TE in each column may be connected to multiple driving lines TL in a one-to-one manner. A driving contact portion CTA1 may be formed at a connection point where the driving electrodes TE in each column and the driving line TL are connected. The driving lines TL may extend in a direction to which an end 1301 of the display panel 100 is positioned, which is a direction in which the display panel 100 slides out. The driving lines TL may include a first sub-section 5112 including the columnar conductors 700 and a second sub-section 5111 that does not include the columnar conductors 700.

A length of the first sub-section 5112 of each of the driving lines TL may be deigned to compensate for a sensing deviation due to a curvature deviation for each section in case that the display panel is rolled. For example, as the first section (see, e.g., 1201 in FIG. 12) relatively close to the rolling axis 1300 is rolled with a relatively large first curvature, the columnar conductors 700 included in the first section (sec, e.g., 1201 in FIG. 12) may have a relatively large change in resistance. On the other hand, as the second section (see, e.g., 1202 in FIG. 12) relatively far from the rolling axis 1300 is rolled with a relatively small second curvature, the columnar conductors 700 included in the second section 1202 may have a relatively small change in resistance. The length of the first sub-section 5112 of each of the second driving lines TL2 may be designed to compensate for the deviation of the change in resistance.

The length of the first sub-section 5112 may increase from the driving line TL connected to a first column closest to the rolling axis 1300 toward the driving line TL connected to an n-th column farthest from the rolling axis in a state in which the display device 10 is fully unrolled. For example, FIG. 13 schematically illustrates the first driving contact portion CTA11, the second driving contact portion CTA12, and the third driving contact portion CTA13. Among the first driving contact portion CTA11, the second driving contact portion CTA12, and the third driving contact portion CTA13, the first driving contact portion CTA11 may be positioned closest to the rolling axis. Among the first driving contact portion CTA11, the second driving contact portion CTA12, and the third driving contact portion CTA13, the third driving contact portion CTA13 may be positioned farthest from the rolling axis. A length of a first sub-section 5112*b* connected to the second driving contact portion CTA12 may be greater than a length of the first sub-section 5112*a* connected to the first driving contact portion CTA11, and a length of the first sub-section 5112*c* connected to the third driving contact portion CTA13 may be greater than the length of the first sub-section 5112*b* connected to the second driving contact portion CTA12.

The length of the first sub-section 5112 may increase step by step. For example, the length of the first sub-section 5112 may increase from the rolling axis at each period (e.g., each designated period). The period may be set based on a thickness of the display panel 100. For example, the period may be $2\pi T$. $\pi$ may be a circumferential ratio and T may be the thickness of the display panel 100.

Figure 14:
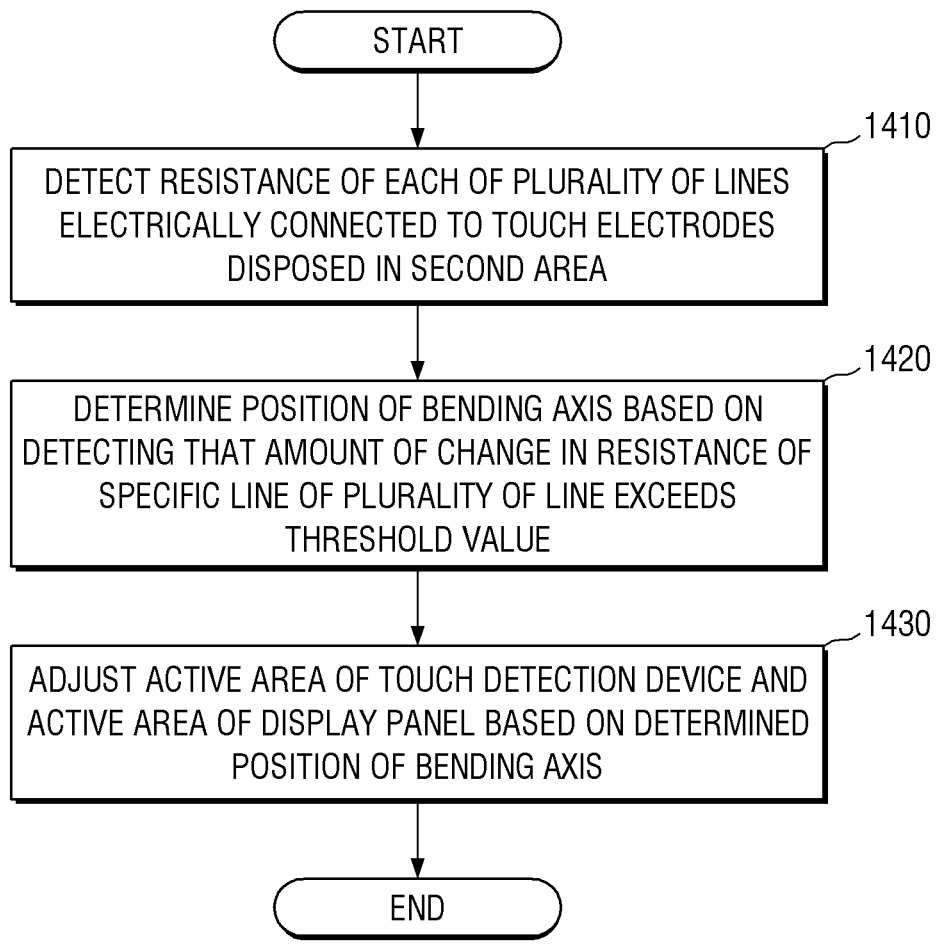
FIG. 14 is a flowchart schematically illustrating an operation of a display device according to embodiments.

FIG. 14 is a flowchart schematically illustrating an operation of a display device 10 according to embodiments.

At least some of the operations illustrated in FIG. 14 may be omitted. Before or after at least some of the operations illustrated in FIG. 14, at least some of the operations mentioned with reference to other drawings in the disclosure may be additionally inserted. Hereinafter, an operation of the display device 10 according to embodiments will be described with reference to FIG. 14.

In operation 1410, the display device 10 may detect resistance of each of multiple lines (e.g., second driving lines TL2) electrically connected to touch electrodes (e.g., second driving electrodes TE) disposed in a second area (see, e.g., TSA2 in FIG. 4). For example, the touch area TSA of the display device 10 may include multiple driving electrodes TE arranged in a vertical direction and multiple detecting electrodes RE arranged in the vertical direction, and may include a first area TSA1 that is flat regardless of a state change of the display device 10, and a second area (see, e.g., TSA2 in FIG. 4) disposed at an end of the first area (see, e.g., TSA1 in FIG. 4) and flattened or bent according to the state change of the display device 10. The display device 10 may include multiple second driving lines (sec, e.g., TL2 in FIG. 4) connected to the driving electrodes TE disposed in the second area TSA2, and some of the second driving lines TL2 may include a first line section (see, e.g., 511 in FIG. 5) disposed in a horizontal direction and a second line section (see, e.g., 512 in FIG. 5) that is bent at an end of the first line section 511 and disposed in the vertical direction.

As a portion of the first line section 511 includes columnar conductors (see, e.g., 700 in FIG. 7), a change in resistance may occur in each of the second driving lines TL2 in case that a portion of the second area TSA2 is bent. The display device 10 may detect the resistance of each of the second driving lines TL2 to detect the change in resistance.

It is described with reference to FIG. 14 that the touch area TSA of the display device 10 includes the first area TSA1 and the second area TSA2, but the disclosure is not limited thereto. For example, the touch area TSA may further include a third area TSA3 disposed at another end of the first area TSA1, and the third area TSA3 and the second area TSA 2 may be similar.

In operation 1420, the display device 10 may determine a position of the bending axis based on detecting that a change in resistance of a specific line of the lines exceeds a threshold value. For example, in case that a portion of the second area TSA2 is bent, an arrangement (e.g., ligament movement) of the columnar conductors 700 may change in a specific line, which may increase resistance of the specific line. In case that a change amount (see, e.g., 803 in FIG. 8) of the resistance exceeds a threshold value (e.g., a designated threshold value), the touch control circuit of the display device 10 may determine that the first bending axis BA1 is positioned to correspond to a column connected to the second driving line TL2 that detects the change of the second driving electrodes TE2.

In operation 1430, the display device 10 may adjust an active area of the touch detection device and an active area of the display panel 100 based on a determined position of the bending axis.

The touch control circuit may adjust an active area and a non-active area based on the determined position of the first bending axis (see, e.g., BA1 in FIG. 4). The touch control circuit may control so that a portion of the second area TSA2 does not perform a touch operation by blocking a driving signal to the second driving electrodes TE2 determined as the non-active area. For example, the touch control circuit may supply a touch driving signal to some driving lines corresponding to the active area, and may not supply the touch driving signal to remaining driving lines corresponding to the non-active area. Similar to the operation of the touch control circuit, the display driving portion may adjust the active area and the non-active area of the display panel 100 based on the second driving line TL2 where a change in resistance equal to or greater than a threshold value is detected.

Figure 15:
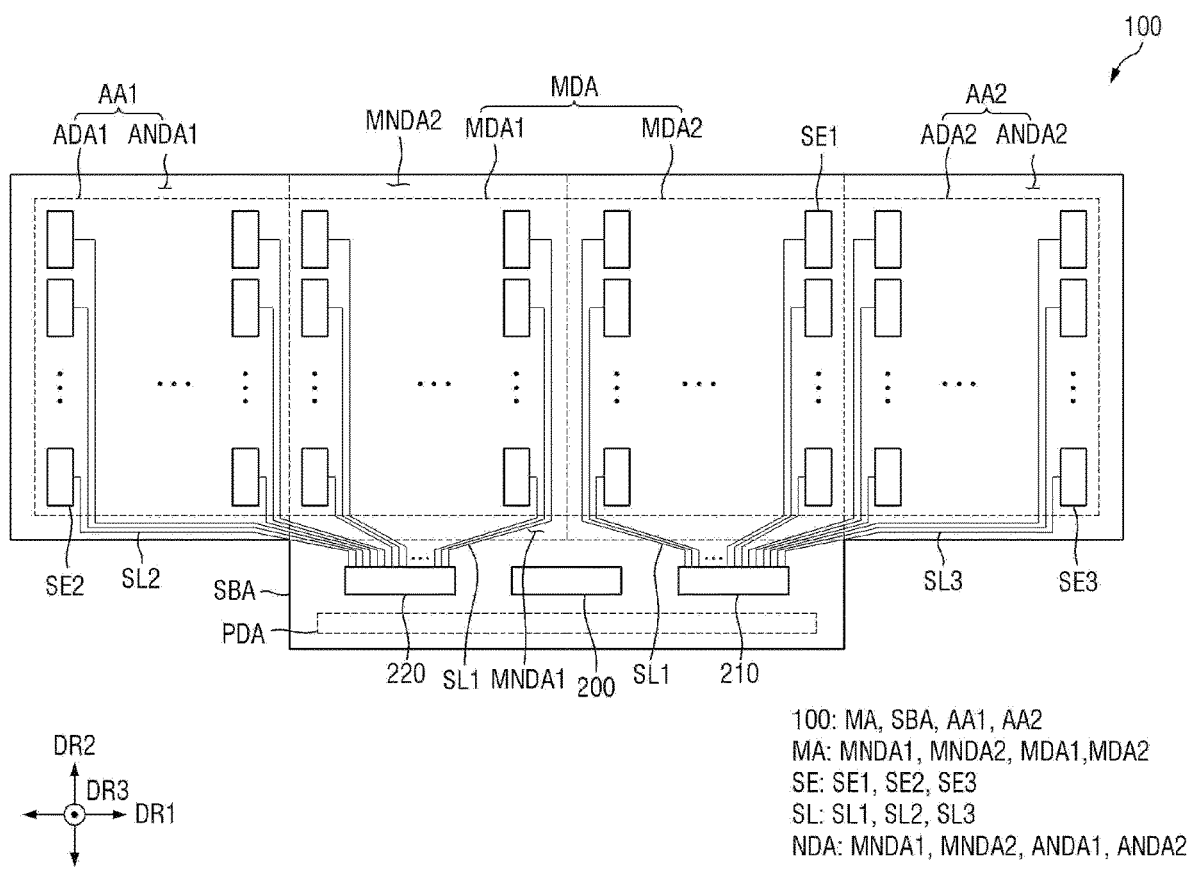
FIG. 15 is a schematic plan view illustrating a layout of sensor electrodes and sensor lines of a touch detecting portion of a display panel according to another embodiment.
Figure 16:
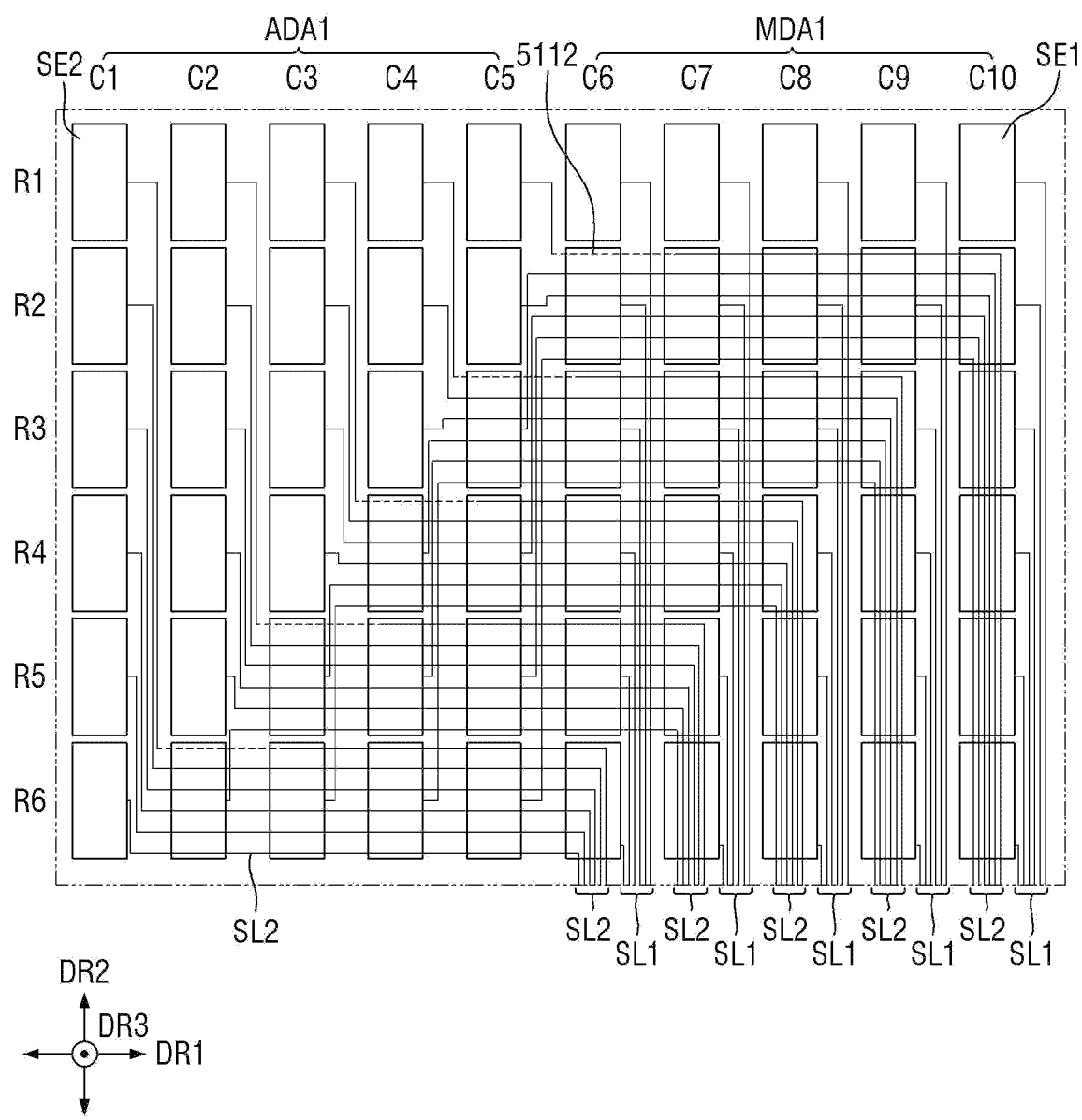
FIG. 16 is a schematic plan view illustrating a layout of first sensor electrodes, second sensor electrodes, first sensor lines, and second sensor lines in a first main display area and a first auxiliary display area of FIG. 15 according to an embodiment.

FIG. 15 is a schematic plan view illustrating a layout of sensor electrodes SE and sensor lines SL of a touch detecting portion of a display panel 100 according to another embodiment. FIG. 16 is a schematic plan view illustrating a layout of first sensor electrodes SE1, second sensor electrodes SE2, first sensor lines SL1, and second sensor lines SL2 in a first main display area MDA1 and a first auxiliary display area ADA1 of FIG. 15 according to an embodiment.

The display device 10 illustrated in FIGS. 15 and 16 and the display device 10 illustrated in FIGS. 1 to 11 may be at least partially similar. Hereinafter, only components different from components of the display panel 100 illustrated in FIGS. 1 to 11 will be described with reference to FIGS. 15 and 16. Therefore, hereinafter, components that are not described in relation to FIGS. 15 and 16 will be replaced with the descriptions related to FIGS. 1 to 11.

Referring to FIGS. 15 and 16, unlike the display panel 100 illustrated in FIGS. 1 to 11, the display panel 100 may include sensor electrodes of a self-capacitance type and sensor lines connected to the sensor electrodes.

Referring to FIG. 15, the display panel 100 may include a display area DA and a non-display area NDA. The display area DA may be an area in which an image is displayed, and the non-display area NDA may be an area in which an image is not displayed. The non-display area NDA may be disposed adjacent to the display area DA. For example, the non-display area NDA may be disposed to surround the display area DA.

The display area DA and the non-display area NDA may be disposed in the main area MA, the first auxiliary area AA1, and the second auxiliary area AA2.

The non-display area NDA may include a first main non-display area MNDA1 disposed at a lower edge of the main area MA and a second main non-display area MNDA2 disposed at an upper edge of the main area MA. The first main non-display area MNDA1 may be disposed between a main display area MDA and the sub-area SBA.

The non-display area NDA may further include a first auxiliary non-display area ANDA1 disposed at an upper edge, a lower edge, and a left edge of the first auxiliary area AA1 and a second auxiliary non-display area ANDA2 disposed on an upper edge, a lower edge, and a right edge in the second auxiliary area AA2. The first main non-display area MNDA1 may be disposed adjacent to the sub-area SBA.

The display area DA may be an area of the main area MA. The display area DA may include a first main display area MDA1 and a second main display area MDA2 disposed in the main area MA, a first auxiliary display area ADA1 disposed in the first auxiliary area AA1, and a second auxiliary display area ADA2 disposed in the second auxiliary area AA2.

The first main display area MDA1 may be disposed adjacent to the first auxiliary display area ADA1, and the second main display area MDA2 may be disposed adjacent to the second auxiliary display area ADA2. The first main display area MDA1 may be disposed between the first auxiliary display area ADA1 and the second main display area MDA2, and the second main display area MDA2 may be disposed between the second auxiliary display area ADA2 and the first main display area MDA1.

The display panel 100 may include sensor electrodes SE and sensor lines SL. The sensor electrodes SE may include first sensor electrodes SE1 disposed in the first main display area MDA1 and the second main display area MDA2, second sensor electrodes SE2 disposed in the first auxiliary display area ADA1, and third sensor electrodes SE3 disposed in the second auxiliary display area ADA2. The sensor lines SL may include first sensor lines SL1 connected to the first sensor electrodes SE1, second sensor lines SL2 connected to the second sensor electrodes SE2, and third sensor lines SL3 connected to the third sensor electrodes SE3.

The first sensor electrodes SE1 may be arranged in a matrix shape in the first direction DR1 and the second direction DR2 in the first main display area MDA1 and the second main display area MDA2. The second sensor electrodes SE2 may be arranged in a matrix shape in the first direction DR1 and the second direction DR2 in the first auxiliary display area ADA1. The third sensor electrodes SE3 may be arranged in a matrix shape in the first direction DR1 and the second direction DR2 in the second auxiliary display area ADA2. Each of the first sensor electrodes SE1, the second sensor electrodes SE2, and the third sensor electrodes SE3 may overlap multiple pixels in a plan view.

The first sensor electrodes SE1 may be connected to the first sensor lines SL1 in a one-to-one manner. Each of the first sensor electrodes SE1 may be connected to a first sensor line SL1, and each of the first sensor lines SL1 may be connected to a first sensor electrode SE1. Therefore, the number of first sensor electrodes SE1 and the number of first sensor lines SL1 may be the same.

The second sensor electrodes SE2 may be connected to the second sensor lines SL2 in a one-to-one manner. Each of the second sensor electrodes SE2 may be connected to a second sensor line SL2, and each of the second sensor lines SL2 may be connected to a second sensor electrode SE2. Therefore, the number of second sensor electrodes SE2 and the number of second sensor lines SL2 may be the same.

The third sensor electrodes SE3 may be connected to the third sensor lines SL3 in a one-to-one manner. Each of the third sensor electrodes SE3 may be connected to a third sensor line SL3, and each of the third sensor lines SL3 may be connected to a third sensor electrode SE3. Therefore, the number of third sensor electrodes SE3 and the number of third sensor lines SL3 may be the same.

The first sensor lines SL1 may be connected to the second pad portion 220 of the sub-area SBA. The second sensor lines SL2 may be connected to the second pad portion 220 of the sub-area SBA. The third sensor lines SL3 may be connected to the third pad portion 210 of the sub-area SBA. However, the connection between the sensor lines SL1 to SL3 and the pad portions 210 and 220 is not limited to the embodiment illustrated in FIGS. 15 and 16.

According to an embodiment, the sub-area SBA may further include a display driving portion 200.

Referring to FIG. 16, the first sensor electrodes SE1 may be disposed in six rows and five columns in the first main display area MDA1. For example, the first sensor electrodes SE1 may be disposed in first to sixth rows R1 to R6 and sixth to tenth columns C6 to C10 in the first main display area MDA1.

A length of each of the first sensor electrodes SE1 in the first direction DR1 may be less than a length of each of the first sensor electrodes SE1 in the second direction DR2. A distance between adjacent ones of the first sensor electrodes SE1 in the first direction DR1 may be greater than a distance between adjacent ones of the first sensor electrodes SE1 in the second direction DR2.

The second sensor electrodes SE2 may be disposed in six rows and five columns in the first auxiliary display area ADA1. For example, the second sensor electrodes SE2 may be disposed in first to sixth rows R1 to R6 and first to fifth columns C1 to C5 in the first auxiliary display area ADA1.

A length of each of the second sensor electrodes SE2 in the first direction DR1 may be less than a length of each of the second sensor electrodes SE2 in the second direction DR2. A distance between adjacent ones of the second sensor electrodes SE2 in the first direction DR1 may be greater than a distance between adjacent ones of the second sensor electrodes SE2 in the second direction DR2.

An area of the first sensor electrode SE1 and an area of the second sensor electrode SE2 may be substantially the same. A planar shape of the first sensor electrode SE1 and a planar shape of the second sensor electrode SE2 may be substantially the same.

The first sensor lines SL1 may extend in the second direction DR2. The first sensor lines SL1 may be connected to the first sensor electrodes SE1 in a one-to-one manner. Each of the first sensor lines SL1 may not overlap the first sensor electrodes SE1 in the third direction DR3.

The second sensor lines SL2 may include first sub-sensor lines extending in the second direction DR2 and second sub-sensor lines extending in the first direction DR1. The first direction DR1 may be a direction perpendicular to a bending axis on which the auxiliary display area ADA1 is curved, bent, folded, rolled, and may be, for example, a horizontal direction of the display panel 100. A portion of the second sub-sensor lines extending in the first direction DR1 in each of the second sensor lines SL2 may include a columnar conductor section 5112 including columnar conductors (sec, e.g., 700 in FIG. 7). In FIG. 16, a section illustrated with a dotted line may be the columnar conductor section 5112, and a length and/or width of the columnar conductor section 5112 may be variously designed in consideration of an RC deviation of the line.

The columnar conductor section 5112 may extend in a direction perpendicular to the bending axis on which the auxiliary display area ADA1 is curved, bent, folded, or rolled, and may generate a change in resistance of the second sensor line SL2 in case that the auxiliary display area ADA1 is curved, bent, folded, or rolled. The function and characteristics of the columnar conductor section 5112 illustrated in FIG. 16 and the function and characteristics of the columnar conductors 700 included in the first sub-section 5112 described with reference to FIG. 8 may be substantially the same or similar.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A touch detection device comprising:
a touch area including a plurality of driving electrodes and a plurality of detecting electrodes intersecting the plurality of driving electrodes, and comprising:
   a first area that is flat; and
   a second area that extends from the first area in a first direction and is flat or bent based on a movement of a first roller member;
a first pad portion disposed adjacent to an edge of the touch area and including:
   a first driving pad portion electrically connected to a plurality of first driving electrodes disposed in the first area through a plurality of first driving lines; and
   a first detecting pad portion electrically connected to a plurality of first detecting electrodes disposed in the first area through a plurality of detecting lines; and
a second pad portion disposed adjacent to the edge of the touch area and including a second driving pad portion electrically connected to a plurality of second driving electrodes disposed in the second area through a plurality of second driving lines, wherein
each of the plurality of second driving lines includes:
   a first line section connected to one of the plurality of second driving electrodes and extending in the first direction; and
   a second line section bent from an end of the first line section to a second direction perpendicular to the first direction and connected to the second driving pad portion, and
the first line section includes a first sub-section including a columnar conductor part comprising a plurality of movable columnar conductors directly contacting each other and a second sub-section that does not include the columnar conductor part;
the touch detection device further comprising:
a touch control circuit electrically connected to the plurality of driving electrodes and the plurality of detecting electrodes and detecting a change in capacitance of each of a plurality of touch nodes through the plurality of detecting electrodes,
wherein the touch control circuit detects a resistance of each of the plurality of second driving lines, determines a position of a first bending axis on which the second area is bent based on detecting that an amount of change in resistance of one of the plurality of second driving lines exceeds a threshold, and adjusts an active area of the touch detection device based on the determined position of the first bending axis.

2. The touch detection device of claim 1, wherein
the touch area further comprises a third area extending in a direction opposite to the first direction from the first area and being flat or bent based on a movement of a second roller member,
the touch detection device further comprises a third pad portion including a third driving pad portion electrically connected to a plurality of third driving electrodes disposed in the third area through a plurality of third driving lines and disposed adjacent to the edge of the touch area, each of the plurality of third driving lines includes:
- a first line section connected to one of the plurality of third driving electrodes and extending in the first direction; and
- a second line section bent from an end of the first line section to the second direction and connected to the third driving pad portion, and
- the first line section of each of the plurality of third driving lines includes a first sub-section including the columnar conductor and a second sub-section that does not include the columnar conductor part.

3. The touch detection device of claim 2, wherein the touch control circuit detects a resistance of each of the plurality of third driving lines, determines a position of a second bending axis on which the third area is bent based on detecting that an amount of change in resistance of one of the plurality of third driving lines exceeds the threshold, and adjusts the active area of the touch detection device based on the determined position of the second bending axis.

4. The touch detection device of claim 3, wherein the touch control circuit supplies a touch driving signal to the plurality of first driving lines, the plurality of second driving lines, and the plurality of third driving lines disposed in the active area, and does not to supply the touch driving signal to the plurality of first driving lines, the plurality of second driving lines, and the plurality of third driving lines not disposed in the active area.

5. The touch detection device of claim 1, further comprising:
a plurality of driving contact portions connecting the plurality of second driving lines and the plurality of second driving electrodes, wherein
the plurality of driving contact portions are connected to the plurality of second driving electrodes in each column in a one-to-one manner, and
distances between a first boundary between the first area and the second area and the plurality of driving contact portions are different.

6. The touch detection device of claim 5, wherein the distances between the first boundary and the plurality of driving contact portions increase from one of the plurality of first driving contact portions connected to one of the plurality of second driving electrodes disposed in a column closest to the first boundary portion toward another one of the plurality of driving contact portions connected to another one of the plurality of second driving electrodes disposed in another column farthest from the first boundary portion.

7. The touch detection device of claim 5, wherein
the plurality of driving electrodes disposed in a column are electrically connected to each other through a bridge electrode, and
the plurality of second driving lines and the bridge electrode are formed on a same layer.

8. The touch detection device of claim 5, wherein each of the plurality of driving contact portions includes:
a first overlapping portion overlapping the plurality of driving electrodes in a plan view and being a portion of the first sub-section including the columnar conductor part; and
a second overlapping portion overlapping the plurality of driving electrodes in a plan view, surrounding an edge of the first overlapping portion in a plan view, and not including the columnar conductor part.

9. The touch detection device of claim 8, wherein an area occupied by the second overlapping portion in each of the plurality of driving contact portions increases from one of the plurality of driving contact portions disposed in a column closest to the first boundary portion toward another one of the plurality of driving contact portions disposed in another column farthest from the first boundary portion.

10. The touch detection device of claim 1, further comprising:
a plurality of detecting contact portions connecting the plurality of first detecting lines and the plurality of first detecting electrodes in the first area, wherein
the plurality of detecting contact portions are connected to the plurality of first detecting electrodes in each row, and
two of the plurality of detecting contact portions are formed in each row.

11. The display device of claim 1, wherein the plurality of movable columnar conductors change a positional arrangement relative to each other in response to movement across the first roller member.

12. The display device of claim 1, wherein the second area is bent around the first bending axis of the first roller member based on a movement of the second area across the first roller member in the first direction.

13. A display device comprising:
a light emitting layer disposed on a substrate and emitting light; and
a touch detecting portion disposed on the light emitting layer and detecting a touch input, wherein
the touch detecting portion includes:
a touch area including a plurality of driving electrodes and a plurality of detecting electrodes intersecting the plurality of driving electrodes, and comprising:
a first area that is flat; and
a second area that extends from the first area in a first direction and is flat or bent based on a movement of a first roller member;
a first pad portion disposed adjacent to an edge of the touch area and including:
a first driving pad portion electrically connected to a plurality of first driving electrodes disposed in the first area through a plurality of first driving lines; and
a first detecting pad portion electrically connected to a plurality of first detecting electrodes disposed in the first area through a plurality of detecting lines; and
a second pad portion disposed adjacent to the edge of the touch area and including a second driving pad portion electrically connected to a plurality of second driving electrodes disposed in the second area through a plurality of second driving lines,
each of the plurality of second driving lines includes:
a first line section connected to one of the plurality of second driving electrodes and extending in the first direction; and
a second line section bent from an end of the first line section to a second direction perpendicular to the first direction and connected to the second driving pad portion, and
the first line section includes a first sub-section including a columnar conductor part comprising a plurality of movable columnar conductors directly contacting each other and a second sub-section that does not include the columnar conductor part;
the display device further comprising:
a touch control circuit electrically connected to the plurality of driving electrodes and the plurality of detecting electrodes and detecting a change in capacitance of each of a plurality of touch nodes through the plurality of detecting electrodes, wherein the touch control circuit: detects a resistance of each of the plurality of second driving lines, determines a position of a first bending axis on which the second area is bent based on detecting that an amount of change in resistance of one of the plurality of second driving lines exceeds a threshold, and adjusts an active area of the touch detection device based on the determined position of the first bending axis.

14. The display device of claim 13, wherein the touch area further comprises a third area extending in a direction opposite to the first direction from the first area and being flat or bent based on a movement of a second roller member, the touch detection device further comprises a third pad portion including a third driving pad portion electrically connected to a plurality of third driving electrodes disposed in the third area through a plurality of third driving lines and disposed adjacent to the edge of the touch area, each of the plurality of third driving lines includes:
 a first line section connected to one of the plurality of third driving electrodes and extending in the first direction; and
 a second line section bent from an end of the first line section to the second direction and connected to the third driving pad portion, and the first line section of each of the plurality of third driving lines includes a first sub-section including the columnar conductor part and a second sub-section that does not include the columnar conductor part.

15. The display device of claim 14, wherein the touch control circuit detects a resistance of each of the plurality of third driving lines, determines a position of a second bending axis on which the third area is bent based on detecting that an amount of change in resistance of one of the plurality of third driving lines exceeds the threshold, and adjusts an active area of the touch detection device based on the determined position of the second bending axis.

16. The display device of claim 15, wherein the touch control circuit supplies a touch driving signal to the plurality of first driving lines, the plurality of second driving lines, and the plurality of third driving lines disposed in the active area, and does not supply the touch driving signal to the plurality of first driving lines, the plurality of second driving lines, and the plurality of third driving lines not disposed in the active area.

17. The display device of claim 13, further comprising:
 a plurality of driving contact portions connecting the plurality of second driving lines and the plurality of second driving electrodes, wherein
 the plurality of driving contact portions are connected to the plurality of second driving electrodes in each column in a one-to-one manner, and
 distances between a first boundary between the first area and the second area and the plurality of driving contact portions are different.

18. The display device of claim 17, wherein the distances between the first boundary and the plurality of driving contact portions increase from one of the plurality of first driving contact portions connected to one of the plurality of second driving electrodes disposed in a column closest to the first boundary portion toward another one of the plurality of driving contact portions connected to another one of the plurality of second driving electrodes disposed in another column farthest from the first boundary portion.

19. The display device of claim 17, wherein
 the plurality of driving electrodes disposed in a column are electrically connected to each other through a bridge electrode, and
 the plurality of second driving lines and the bridge electrode are formed on a same layer.

20. The display device of claim 17, wherein each of the plurality of driving contact portions includes:
 a first overlapping portion overlapping the plurality of driving electrodes in a plan view and being a portion of the first sub-section including the columnar conductor part; and
 a second overlapping portion overlapping the plurality of driving electrodes in a plan view, surrounding an edge of the first overlapping portion in a plan view, and not including the columnar conductor part.

* * * * *